(12) United States Patent
Fang

(10) Patent No.: US 11,276,661 B2
(45) Date of Patent: Mar. 15, 2022

(54) PACKAGE STRUCTURE INCLUDING TWO JOINT STRUCTURES INCLUDING DIFFERENT MATERIALS AND METHOD FOR MANUFACTURING THE SAME

(71) Applicant: Advanced Semiconductor Engineering, Inc., Kaohsiung (TW)

(72) Inventor: Hsu-Nan Fang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/882,253

(22) Filed: May 22, 2020

(65) Prior Publication Data
US 2021/0366864 A1 Nov. 25, 2021

(51) Int. Cl.
*H01L 23/00* (2006.01)
(52) U.S. Cl.
CPC ............. *H01L 24/24* (2013.01); *H01L 24/05* (2013.01); *H01L 24/14* (2013.01); *H01L 24/82* (2013.01); *H01L 2224/14505* (2013.01); *H01L 2224/82214* (2013.01); *H01L 2924/0105* (2013.01); *H01L 2924/01029* (2013.01); *H01L 2924/01047* (2013.01); *H01L 2924/18165* (2013.01)

(58) Field of Classification Search
CPC combination set(s) only.
See application file for complete search history.

(56) References Cited

U.S. PATENT DOCUMENTS

| | | | |
|---|---|---|---|
| 7,187,066 B2 | 3/2007 | Frutschy | |
| 2009/0014848 A1* | 1/2009 | Ong Wai Lian | H01L 24/85 257/666 |
| 2009/0058435 A1* | 3/2009 | Nakamura | G01R 31/71 324/719 |
| 2009/0294945 A1* | 12/2009 | Okada | H01L 25/0657 257/686 |
| 2014/0110835 A1* | 4/2014 | Ong | H01L 24/13 257/737 |
| 2015/0163907 A1* | 6/2015 | Chang | H05K 1/0259 361/761 |
| 2018/0019174 A1* | 1/2018 | Lin | H01L 24/11 |
| 2020/0013743 A1* | 1/2020 | Kim | H01L 23/49827 |
| 2021/0066184 A1* | 3/2021 | Aleksov | H01L 28/40 |

* cited by examiner

*Primary Examiner* — Mamadou L Diallo
(74) *Attorney, Agent, or Firm* — Foley & Lardner LLP

(57) ABSTRACT

A package structure and a method for manufacturing a package structure are provided. The package structure includes a first wiring structure and at least one electronic device. The at least one electronic device is connected to the first wiring structure through at least two joint structures. The at least two joint structures respectively include different materials.

20 Claims, 30 Drawing Sheets

PACKAGE STRUCTURE INCLUDING TWO JOINT STRUCTURES INCLUDING DIFFERENT MATERIALS AND METHOD FOR MANUFACTURING THE SAME

BACKGROUND

1. Field of the Disclosure

The present disclosure relates to a package structure, and a manufacturing method, and to a package structure including at least two joint structures respectively including different materials, and a method for manufacturing the same.

2. Description of the Related Art

Along with the rapid development in electronics industry and the progress of semiconductor processing technologies, semiconductor chips are integrated with an increasing number of electronic components to achieve better electrical performance and more functions. Accordingly, the semiconductor devices are provided with more structures of various materials. As such, coefficient of thermal expansion (CTE) mismatch issues have become increasingly crucial to the manufacture of semiconductor packages including such semiconductor devices.

SUMMARY

In some embodiments, a package structure includes a first wiring structure and at least one electronic device. The at least one electronic device is connected to the first wiring structure through at least two joint structures. The at least two joint structures respectively include different materials.

In some embodiments, a package structure includes a first wiring structure, a first electronic device, a second wiring structure, a lower electronic device, a molding compound and a substrate structure. The first electronic device is connected to the first wiring structure. The lower electronic device is disposed on the second wiring structure. An active surface of the lower electronic device is facing an active surface of the first electronic device. The molding compound encapsulates the lower electronic device. The first wiring structure is disposed on the molding compound, and a bonding pad is disposed on the second wiring structure. The substrate structure is connected to the second wiring structure through at least two bonding structures. The at least two bonding structures respectively include different materials.

In some embodiments, a method for manufacturing a package structure includes the following operations: (a) providing a first wiring structure; (b) providing a first electronic device; (c) bonding the first electronic device to the first wiring structure through a first joint structure under a first temperature; and (d) bonding the first electronic device to the first wiring structure through a second joint structure under a second temperature, wherein the first temperature is higher than the second temperature.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
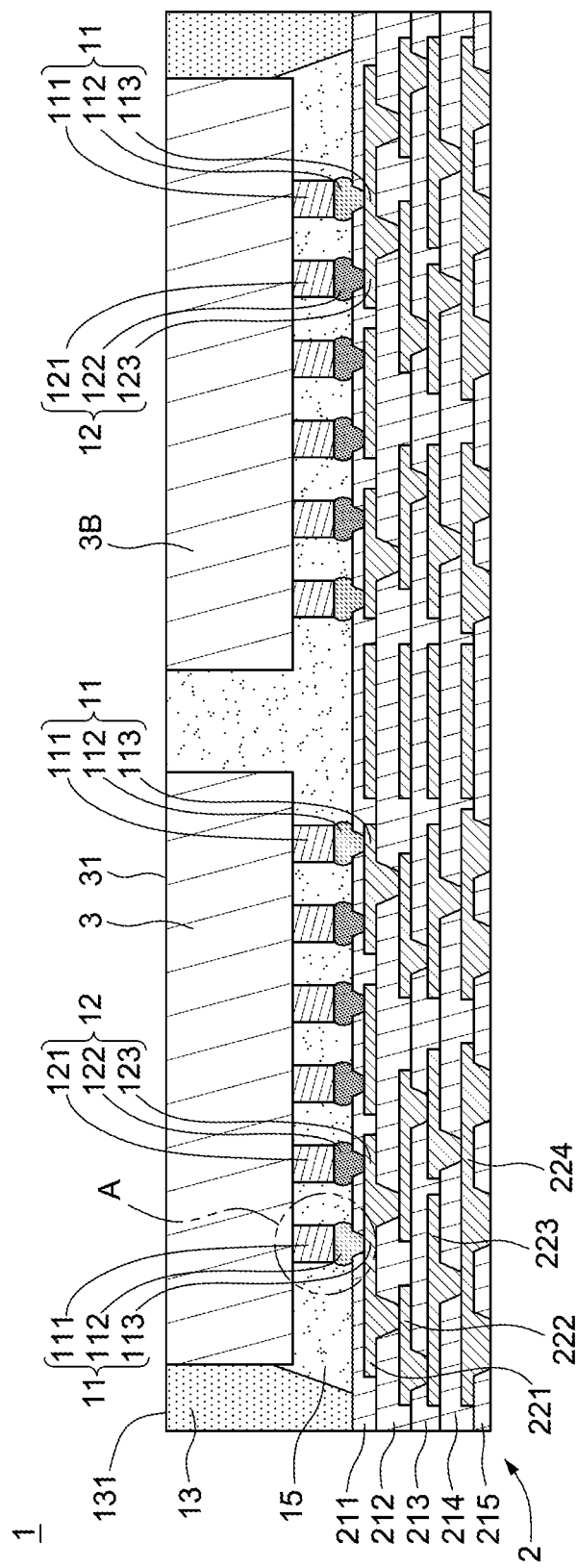
FIG. 1A illustrates a cross-sectional view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A illustrates a cross-sectional view of a package structure 1 according to some embodiments of the present disclosure. The package structure 1 includes a first wiring structure 2, at least one electronic device (including, for example, a first electronic device 3 and a second electronic device 3B), at least one first joint structure 11, at least one second joint structure 12, an encapsulant 13, and an underfill 15.

The first wiring structure 2 may include at least one dielectric layer (including, for example, dielectric layers 211, 212, 213, 214 and 215) and at least one circuit layer (including, for example, circuit layers 221, 222, 223 and 224 formed of a metal, a metal alloy, or other conductive material). The at least one circuit layer may be in contact with the at least one dielectric layer. In some embodiments, the dielectric layer may be made of a cured photoimageable dielectric (PID) material such as epoxy or polyimide (PI) including photoinitiators. In addition, the dielectric layer may include no fibers (e.g., glass fibers). In some embodiments, the first wiring structure 2 may be a bumping level redistribution structure. The circuit layers 221, 222, 223 and 224 may be fan-out circuit layers or redistribution layers (RDLs), and an L/S of the circuit layers 221, 222, 223 and 224 may be less than or equal to about 10 μm/about 10 about 5 μm/about 5 μm, about 2 μm/about 2 μm, or less than or equal to about 1.8 μm/about 1.8 μm. In some embodiments, the circuit layers 221, 222, 223 and 224 are embedded in the dielectric layers. In some embodiments, the circuit layers 221, 222, 223 and 224 include horizontally connecting or extending circuit layers. The first wiring structure 2 may further include a plurality of inner vias. The inner vias are disposed between the circuit layers for electrically connecting the circuit layers. In some embodiments, each inner via and the corresponding circuit layer may be formed integrally as a monolithic or one-piece structure. The inner vias may have a tapered cross-sectional shape.

The first electronic device 3 and the second electronic device 3B are connected to the first wiring structure 2 through the joint structures 11, 12. In some embodiments, the first electronic device 3 and the second electronic device 3B are arranged side by side. In some embodiments, the first electronic device 3 and the second electronic device 3B may independently be or include an active component such as an application specific IC (ASIC), a memory component such as a high bandwidth memory (HBM) component or another active component. In some embodiments, the first electronic device 3 may be an application specific IC (ASIC), and the second electronic device 3B may be a high bandwidth memory (HBM). In some embodiments, as shown in FIG. 1A, the package structure 1 includes two electronic devices (e.g., the first electronic device 3 and the second electronic device 3B), but the present disclosure is not limited thereto.

The first joint structure 11 and the second joint structure 12 respectively include different materials. In some embodiments, the first joint structure 11 includes a first material, and the second joint structure 12 includes a second material different from the first material. In some embodiments, a melting point of the first material is higher than a melting point of the second material. In some embodiments, the first material includes a gold-tin (AuSn) alloy, and the second material includes copper (Cu). In some embodiments, the first material includes silver (Ag) paste, copper (Cu) paste, or a combination thereof, and the second material includes tin (Sn).

In a comparative embodiment, the CTE-mismatch issue caused by the difference between the CTE of a wiring structure and the CTE of an electronic device may cause different deformation levels between different structures and thereby may cause serious warpage to a package structure. In comparison, according to some embodiments of the present disclosure, the design of the two joint structures 11, 12 respectively including different materials can provide different stress on different locations within the package structure 1, particularly between the first wiring structure 2 and the electronic device (e.g., the first electronic device 3 and/or the second electronic device 3B), and such difference in stress can compensate the strain resulted from the CTE-mismatch within the package structure 1. Therefore, the bonding strength may be improved, the overall structure of the package structure 1 may be more stable, and the quality as well as the performance of the package structure 1 may be improved.

In some embodiments, the first joint structure 11 includes a first bump 111 disposed on the first electronic device 3 (or the second electronic device 3B). In some embodiments, the first joint structure 11 includes a first pad 113 disposed in the first wiring structure 2. In some embodiments, the first pad 113 may be a portion of the circuit layer 221. In some embodiments, the first joint structure 11 includes a first solder 112 disposed between the first wiring structure 2 and a bump of the first electronic device 3. In some embodiments, the first solder 112 is disposed between the first pad 113 and the first bump 111. In some embodiments, the first bump 111, the first solder 112, and/or the first bump 113 includes the first material. In some embodiments, the first joint structure 11 may be a dummy connecting component. In some other embodiments, the first joint structure 11 may be connected to a ground pad and/or a power pad. According to some embodiments of the present disclosure, I/O counts are higher in the region including a power pad and/or a ground pad, the first joint structures 11 including the first material can further apply stress on the chosen region to balance the strain and reduce the warpage level.

In some embodiments, the second joint structure 12 includes a second bump 121 disposed on the electronic device 3 (or the second electronic device 3B). In some embodiments, the second joint structure 12 includes a second pad 123 disposed in the first wiring structure 2. In some embodiments, the second pad 123 may be a portion of the circuit layer 221. In some embodiments, the second joint structure 12 includes a second solder 122 disposed between the first wiring structure 2 and a bump of the first electronic device 3. In some embodiments, the second solder 122 is disposed between the second pad 123 and the second bump 121. In some embodiments, the second bump 121, the second solder 122, and/or the second bump 123 includes the second material.

In some embodiments, the first bump 111 of the first joint structure 11 includes the first material, and the second bump 121 of the second joint structure 12 includes the second material. In some embodiments, the first material of the first bump 111 may be or include a gold-tin (AuSn) alloy, and the second material of the second bump 121 may be or include copper (Cu).

In some embodiments, the first solder 112 of the first joint structure 11 includes the first material, and the second solder 122 of the second joint structure 12 includes the second material. In some embodiments, the first material of the first solder 112 may be or include silver (Ag) paste, copper (Cu) paste, or a combination thereof, and the second material of the second solder 122 may be or include tin (Sn).

The underfill 15 is disposed in a space between the first wiring structure 2 and the electronic device(s) (e.g., the first electronic device 3 and the second electronic device 3B) to cover and protect the first joint structure 11 and the second joint structure 12. In some embodiments, the underfill 15 directly contacts the first joint structure 11 and the second joint structure 12.

The encapsulant 13 encapsulates the electronic device(s) (e.g., the first electronic device 3 and the second electronic device 3B) and the underfill 15. In some embodiments, the encapsulant 13 exposes a surface 31 (also referred to as "an upper surface") of the electronic device 3. In some embodiments, a surface 131 (also referred to as "an upper surface") of the encapsulant 13 is substantially coplanar with the surface 31 of the surface 31 of the electronic device 3. In some embodiments, the encapsulant 13 may be or include a molding compound.

Figure 1B:
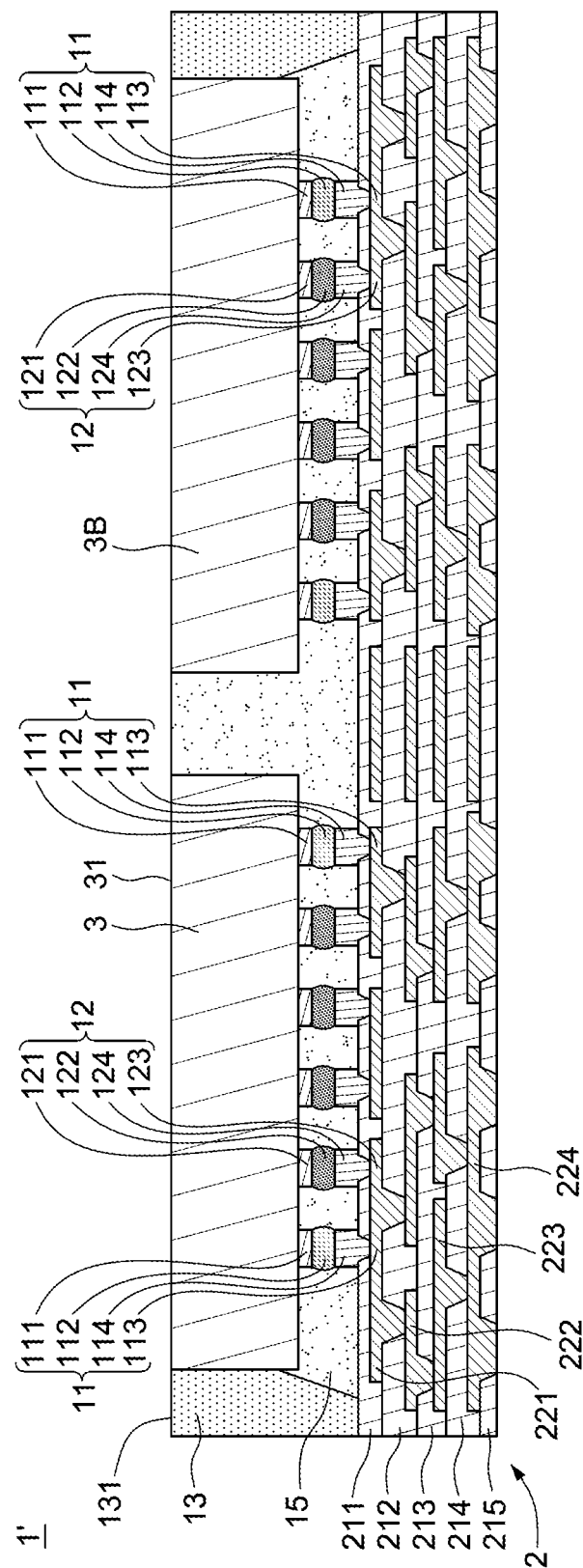
FIG. 1B illustrates a cross-sectional view of a package structure according to some embodiments of the present disclosure.

FIG. 1B illustrates a cross-sectional view of a package structure 1' according to some embodiments of the present disclosure. The package structure 1' is similar to the package structure 1 shown in FIG. 1A, except that the first joint structure 11 of the package structure 1' further includes a first pillar 114 disposed on the first pad 113. In some embodiments, the second joint structure 12 of the package structure 1' further includes a second pillar 124 disposed on the second pad 123.

Figure 2:
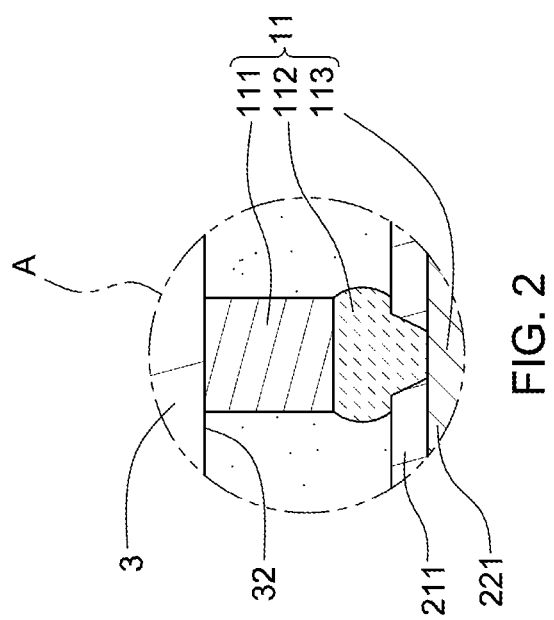
FIG. 2 illustrates an enlarged view of a portion of a package structure according to some embodiments of the present disclosure.

FIG. 2 illustrates an enlarged view of a portion of a package structure according to some embodiments of the present disclosure. In some embodiments, FIG. 2 illustrates an enlarged view of a portion "A" of the package structure 1 shown in FIG. 1A.

As shown in FIG. 2, the first solder 112 is disposed between and directly contacts the first bump 111 and the first pad 113. In some embodiments, the first bump 111 directly contacts the second solder 112 and a surface 32 (also referred to as "a bottom surface") of the first electronic device 3. The surface 32 of the first electronic device 3 may be an active surface.

In a comparative embodiment, the CTE-mismatch issue caused by the difference between the CTE of a wiring structure and the CTE of an electronic device may easily cause serious warpage in the manufacturing process of the package structure, and such warpage may render the solders deform or even detach. In contrast, according to some embodiments of the present disclosure, the design of the first material of the first joint structures 11 has a higher melting point than the second material of the second joint structures 12, the first joint structures 11 may be formed on chosen local regions to stably fix the relative position of the first wiring structure 2 and the electronic device(s) (e.g., the first electronic device 3 and the second electronic device 3B) under a relatively high processing temperature, and then the second joint structures 12 may be formed under a relatively lower temperature performed for a relatively longer time, which facilitates the formation of intermetallic compound (IMC), such that the overall bonding strength of the package structure 1 may be increased.

Figure 3:
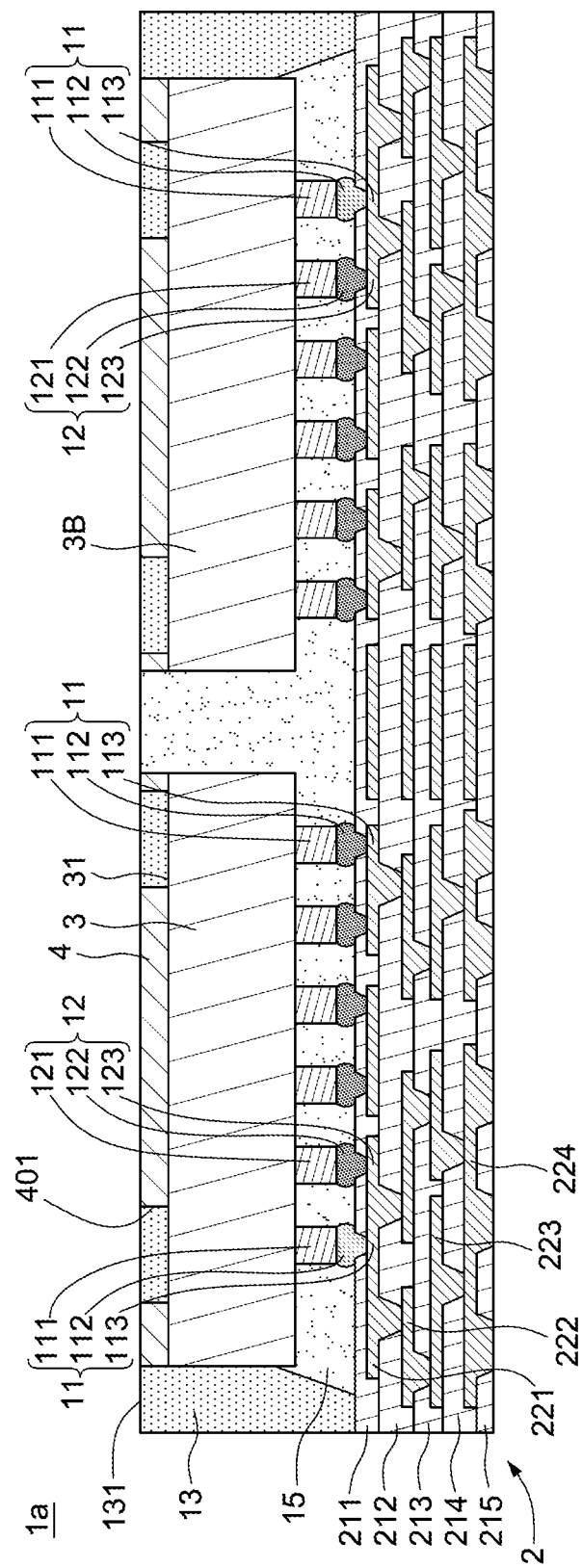
FIG. 3 illustrates a cross-sectional view of a package structure according to some embodiments of the present disclosure.

FIG. 3 illustrates a cross-sectional view of a package structure 1a according to some embodiments of the present disclosure. The package structure 1a is similar to the package structure 1 shown in FIG. 1A, except that the package structure 1a further includes a patterned mask layer 4.

As shown in FIG. 3, in some embodiments, the patterned mask layer 4 is disposed on the surface 31 of the first electronic device 3 (or an upper surface the second electronic device 3B), and the surface 31 (or the upper surface of the second electronic device 3B) is facing away from the first wiring structure 2. In some embodiments, the patterned mask layer 4 is further disposed on the surface 131 of the encapsulant 13. In some embodiments, the patterned mask layer 4 directly contacts the surface 31 of the first electronic device 3 (or the upper surface of the second electronic device 3B). In some embodiments, the patterned mask layer 4 directly contacts the surface 131 of the encapsulant 13.

In some embodiments, the patterned mask layer 4 defines at least one opening 401. In some embodiments, the opening 401 of the patterned mask layer 4 is disposed right above the first joint structure 11. In some embodiments, the first joint structure 11 may be disposed within a projection of the opening 401 of the patterned mask layer 4.

In some embodiments, the patterned mask layer 4 may be or include a sputtered patterned metal. In some embodiments, the patterned mask layer 4 may be or include a Ti/Cu/Ti multilayer or a Ti/Cu/stainless steel multilayer. In some embodiments, the patterned mask layer 4 may have a thickness of about 10 μm. According to some embodiments of the present disclosure, the patterned mask layer 4 including a metal material may be beneficial to increasing the heat dissipation ability.

Figure 4A:
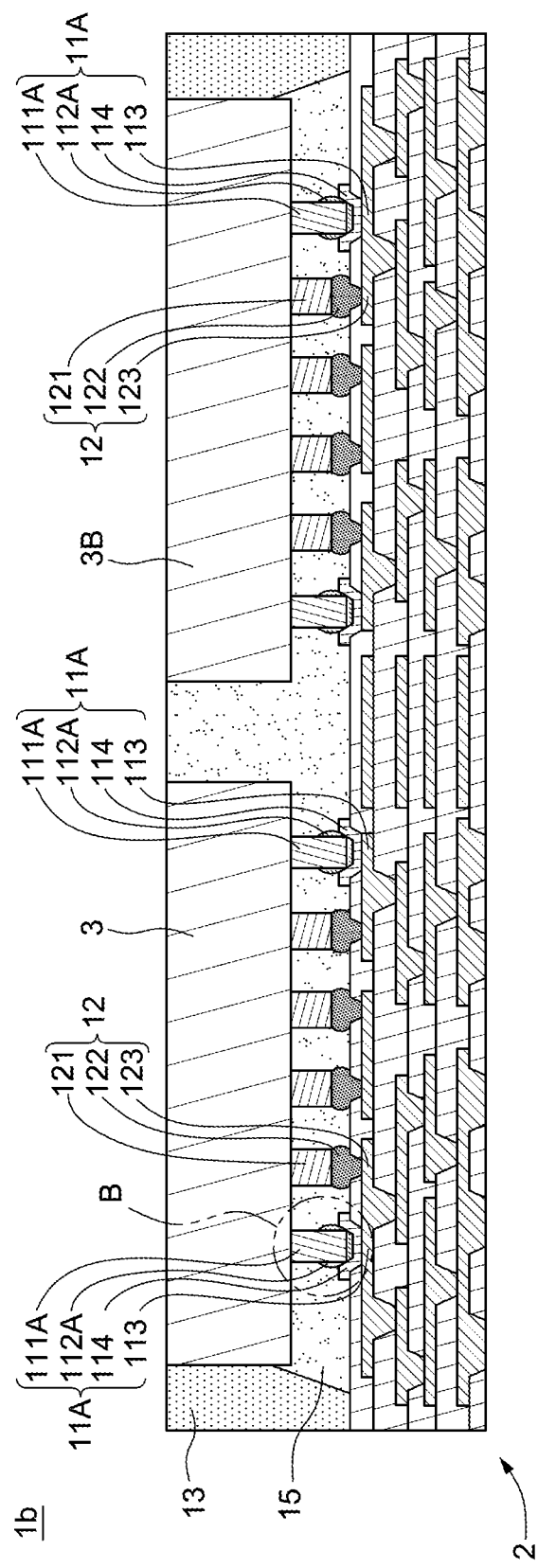
FIG. 4A illustrates a cross-sectional view of a package structure according to some embodiments of the present disclosure.

FIG. 4A illustrates a cross-sectional view of a package structure 1b according to some embodiments of the present disclosure. The package structure 1b is similar to the package structure 1 shown in FIG. 1, except for the structure of the first joint structure 11A.

In some embodiments, as shown in FIG. 4A, the first joint structure 11A includes a first bump 111A disposed on the first electronic device 3 (or the second electronic device 3B), a first pad 113 disposed in the first wiring structure 2, and a first solder 112A disposed between the first pad 113 and the first bump 111A. In some embodiments, the first joint structure 11A further includes a first conductive layer 114 between the first pad 113 and the first solder 112A. In some embodiments, the first conductive layer 114 may be referred to as under bump metallization (UBM). In some embodiments, the first bump 111A, the first solder 112A, the first conductive layer 114, and/or the first pad 113 includes the first material, and the second bump 121, the second solder 122, and/or the second pad 123 includes the second material.

In some embodiments, as shown in FIG. 4A, the first joint structure 11A and the second joint structure 12 have different structures. In some embodiments, the first bump 111A and the second bump 121 have different shapes. For example, the first bump 111A has a height that is greater than a height of the second bump 121. In some embodiments, the first solder 112A and the second solder 122 have different shapes.

In some embodiments, the first material of the first bump 111A may be or include a gold-tin (AuSn) alloy, and the second material of the second bump 121 may be or include copper (Cu). In some embodiments, the first material of the first conductive layer 114 may be or include a gold-tin (AuSn) alloy. In some embodiments, the first solder 112A and the second solder 122 may both be or include tin (Sn).

Figure 4B:
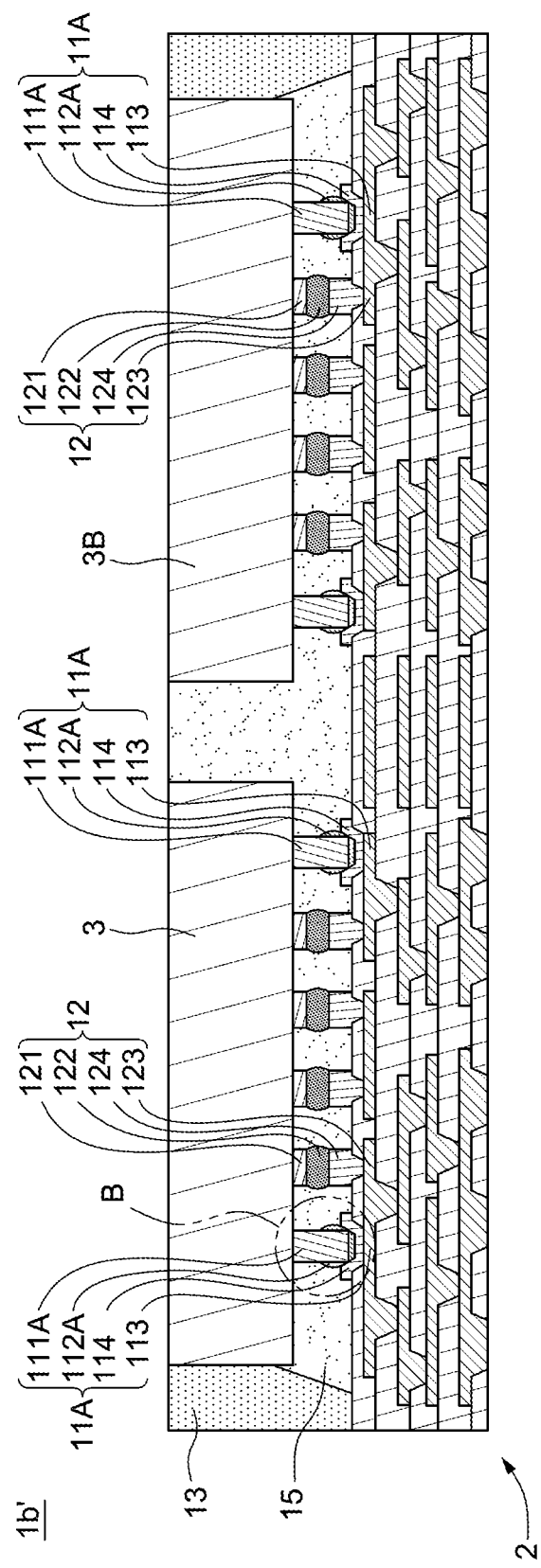
FIG. 4B illustrates a cross-sectional view of a package structure according to some embodiments of the present disclosure.

FIG. 4B illustrates a cross-sectional view of a package structure 1b' according to some embodiments of the present disclosure. The package structure 1b' is similar to the package structure 1b shown in FIG. 4A, except that the second joint structure 12 of the package structure 1b' further includes a second pillar 124 disposed on the second pad 123. In some embodiments, the second pillar 124 of the second joint structure 12 includes the second material. In some embodiments, the second material of the second pillar 124 may be or include copper (Cu).

Figure 5:
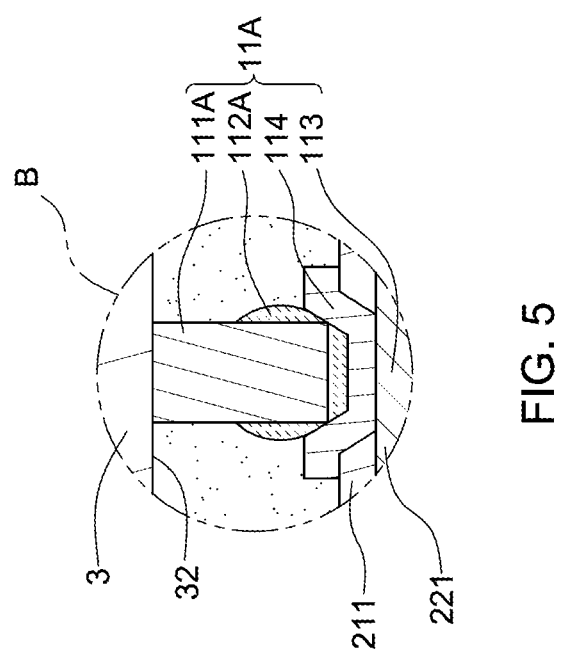
FIG. 5 illustrates an enlarged view of a portion of a package structure according to some embodiments of the present disclosure.

FIG. 5 illustrates an enlarged view of a portion of a package structure according to some embodiments of the present disclosure. In some embodiments, FIG. 5 illustrates an enlarged view of a portion "B" of the package structure 1b shown in FIG. 4A.

As shown in FIG. 5, in some embodiments, the first solder 112A extends on a portion of a sidewall of the first bump 111A. In some embodiments, the first solder 112A covers a portion of a sidewall of the first bump 111A. In some embodiments, the first solder 112A surrounds a portion of a sidewall of the first bump 111A. In some embodiments, the first solder 112A is further filled within a space defined by the first bump 111A and the first conductive layer 114.

As shown in FIG. 5, in some embodiments, the first conductive layer 114 may define a recess portion that is concave towards the first wiring structure 2. In some embodiments, a portion of the first bump 111A is in the recess portion of the first conductive layer 114. In some embodiments, a portion of the first solder 112A is in the recess portion of the first conductive layer 114. In some embodiments, the bottom corners of the first bump 111A directly contact the inner slant surface of the recess portion of first conductive layer 114. In some embodiments, the first conductive layer 114 directly contacts the first solder 112A. In some embodiments, the first bump 111A and the first conductive layer 114 define a space within the recess portion of the first conductive layer 114.

Figure 6:
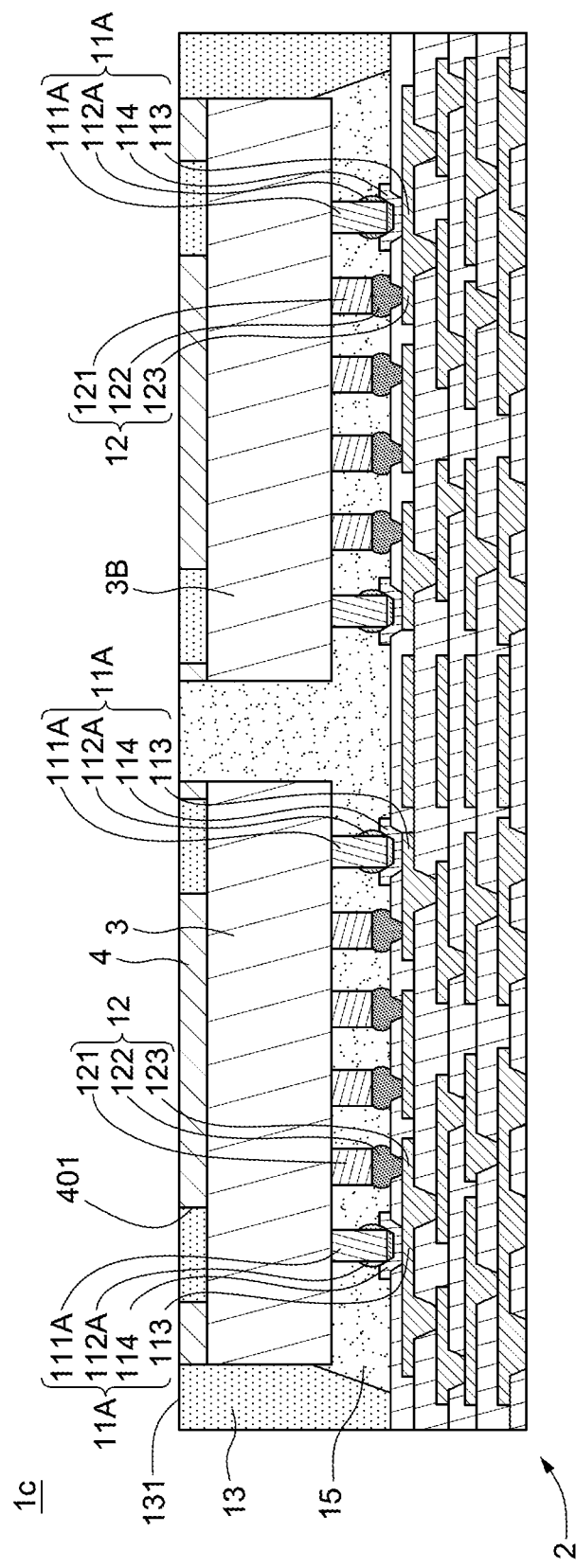
FIG. 6 illustrates a cross-sectional view of a package structure according to some embodiments of the present disclosure.

FIG. 6 illustrates a cross-sectional view of a package structure 1c according to some embodiments of the present disclosure. The package structure 1c is similar to the package structure 1b shown in FIG. 4A, except that the package structure 1c further includes a patterned mask layer 4.

As shown in FIG. 6, in some embodiments, the patterned mask layer 4 is disposed on the surface 31 of the first electronic device 3 (or an upper surface of the second electronic device 3B), and the surface 31 (or the upper surface of the second electronic device 3B) is facing away from the first wiring structure 2. In some embodiments, the patterned mask layer 4 is further disposed on the surface 131 of the encapsulant 13. In some embodiments, the patterned mask layer 4 directly contacts the surface 31 of first the electronic device 3 (or the upper surface of the second electronic device 3B). In some embodiments, the patterned mask layer 4 directly contacts the surface 131 of the encapsulant 13.

In some embodiments, the patterned mask layer 4 defines at least one opening 401. In some embodiments, the opening 401 of the patterned mask layer 4 is disposed right above the first joint structure 11A. In some embodiments, the first joint structure 11A may be disposed within a projection of the opening 401 of the patterned mask layer 4.

Figure 7:
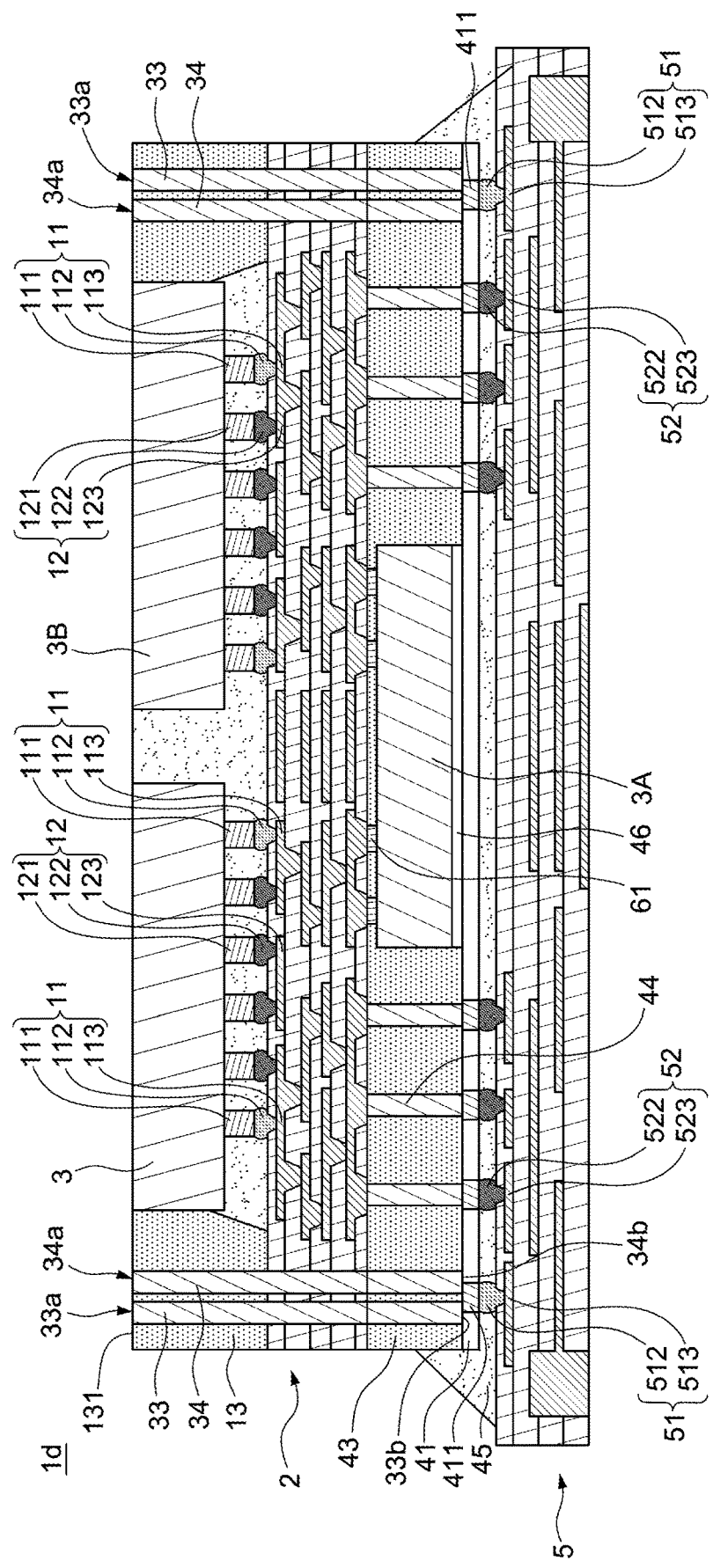
FIG. 7 illustrates a cross-sectional view of a package structure according to some embodiments of the present disclosure.

FIG. 7 illustrates a cross-sectional view of a package structure 1d according to some embodiments of the present disclosure. The package 1d includes a first wiring structure 2, a first electronic device 3, a second electronic device 3B, a lower electronic device 3A, a substrate structure 5, at least one first joint structure 11, at least one second joint structure 12, an encapsulant 13, an underfill 15, a first electrical path 33, a second electrical path 34, a second wiring structure 41, a molding compound 43, an underfill 45, and at least two bonding structures 51, 52. In some embodiments, the first wiring structure 2, the first electronic device 3, the second electronic device 3B, the first joint structure 11, the second joint structure 12, the encapsulant 13 and the underfill 15 are similar to those shown in previous drawing (e.g., FIG. 1A, FIG. 2, FIG. 4A, and FIG. 5), and the details of which are omitted hereinafter.

The lower electronic device 3A is disposed on the second wiring structure 41. In some embodiments, an active surface of the lower electronic device 3A is facing an active surface of the electronic device (e.g., the first electronic device 3 and/or the second electronic device 3B). The lower electronic device 3A may be electrically connected to the first electronic device 3 and the second electronic device 3B through the first wiring structure 2. In some embodiments, the lower electronic device 3A is bonded to and electrically connected to the first wiring structure 2 by the conductive bumps 61. In some embodiments, the first wiring structure 2 is between the electronic device(s) (e.g., the first electronic device 3 and/or the second electronic device 3B) and the lower electronic device 3A. In some embodiments, the lower electronic device 3A may be referred to as a bridge device, and the first electronic device 3 and the second electronic device 3B are electrically connected to each other through the lower electronic device 3A.

The molding compound 43 encapsulates the lower electronic device 3A. In some embodiments, the molding compound 43 and the encapsulant 13 may be or include the same or different materials. In some embodiments, the first wiring structure 2 is disposed on the molding compound 43.

The second wiring structure 41 may be disposed on a bottom surface of the molding compound 43. In some embodiments, at least one bonding pad 411 is disposed in the second wiring structure 41. In some embodiments, the bonding pad 411 extends through the second wiring structure 41. In some embodiments, the second wiring structure 41 may be electrically connected to the first wiring structure 2 through at least one conductive pillar 44. In some embodiments, the conductive pillar 44 extends through the molding compound 43 to connect to the bonding pad 411. In some embodiments, the lower electronic device 3A is disposed between the second wiring structure 41 and the first wiring structure 2. In some embodiments, the lower electronic device 3A is disposed on the second wiring structure 41. In some embodiments, the lower electronic device 3A is attached to the second wiring structure 41 through an adhesion layer 46. In some embodiments, a bonding pad (e.g., the bonding pad 411 and) is disposed on a side of the second wiring structure 41 opposite to the lower electronic device 3A.

The substrate structure 5 may be connected to the second wiring structure 41 through at least two bonding structures (e.g., at least one first bonding structure 51 and at least one second bonding structure 52), and the at least two bonding structures 51, 52 respectively include different materials. In some embodiments, the different materials of the at least two bonding structures 51, 52 have different melting points.

The first bonding structure 51 and the second bonding structure 52 respectively include different materials. In some embodiments, the first bonding structure 51 includes a first bonding material, and the second bonding structure 52 includes a second bonding material different from the first bonding material. In some embodiments, a melting point of the first bonding material is higher than a melting point of the second bonding material. In some embodiments, the first bonding material includes a gold-tin (AuSn) alloy, and the second bonding material includes copper (Cu). In some embodiments, the first bonding material includes silver (Ag) paste, copper (Cu) paste, or a combination thereof, and the second bonding material includes tin (Sn).

In some embodiments, as shown in FIG. 7, the first bonding structure 51 includes a first bonding pad 513 disposed in the substrate structure 5. In some embodiments, the first bonding pad 513 may be a portion of a circuit layer in the substrate structure 5. In some embodiments, the first bonding structure 51 includes a first bonding solder 512 disposed between the substrate structure 5 and a bonding pad of the second wiring structure 41. In some embodiments, the first bonding solder 512 is disposed between the first bonding pad 513 and the bonding pad 411 of the second wiring structure 41. In some embodiments, the first bonding solder 512 and/or the first bonding pad 513 includes the first bonding material.

In some embodiments, as shown in FIG. 7, the second bonding structure 52 includes a second bonding pad 523 disposed in the substrate structure 5. In some embodiments, the second bonding pad 523 may be a portion of a circuit layer in the substrate structure 5. In some embodiments, the second bonding structure 52 includes a second bonding solder 522 disposed between the substrate structure 5 and a bonding pad of the second wiring structure 41. In some embodiments, the second bonding solder 522 is disposed between the second bonding pad 523 and the bonding pad 411 of the second wiring structure 41. In some embodiments, the second bonding solder 522 and/or the second bonding pad 523 includes the second bonding material.

In some embodiments, the first bonding solder 512 of the first bonding structure 51 includes the first bonding material, and the second bonding solder 522 of the second bonding structure 52 includes the second bonding material. In some embodiments, the first bonding material of the first bonding solder 512 may be or include silver (Ag) paste, copper (Cu) paste, or a combination thereof, and the second bonding material of the second bonding solder 522 may be or include tin (Sn).

The underfill 45 is disposed in a space between the substrate structure 5 and the second wiring structure 41 to cover and protect the first bonding structure 51 and the second bonding structure 52. In some embodiments, the underfill 45 directly contacts the first bonding structure 51 and the second bonding structure 52.

In some embodiments, the first electrical path 33 extends through the encapsulant 13. In some embodiments, the second electrical path 34 extends through the encapsulant 13 and is located between the first electrical path 33 and the first electronic device 3. In some embodiments, the first electrical path 33 and the second electrical path 34 further extend through the first wiring structure 2. In some embodiments, the first electrical path 33 and the second electrical path 34 further extend through the molding compound 43. In some embodiments, the first electrical path 33 and the second electrical path 34 are electrically connected to the bonding pad 411. In some embodiments, the first electrical path 33 and the second electrical path 34 physically contact the bonding pad 411.

The first electrical path 33 may have an end 33a and an end 33b opposite the end 33a, and the second electrical path 34 may have an end 34a and an end 34b opposite the end 34a. In some embodiments, the end 33a and the end 34a are facing away from the first wiring structure 2. In some embodiments, the end 33a of the first electrical path 33 and the end 34a of the second electrical path 34 are exposed from the surface 131 of the encapsulant 13. In some embodiments, the end 33b of the first electrical path 33 and the end 34b of the second electrical path 34 are connected to the same bonding pad 411. In some embodiments, the first electrical path 33, the second electrical path 34, and the first bonding solder 512 of the first bonding structure 52 directly contact the bonding pad 411 of the second wiring structure 41.

Figure 8:
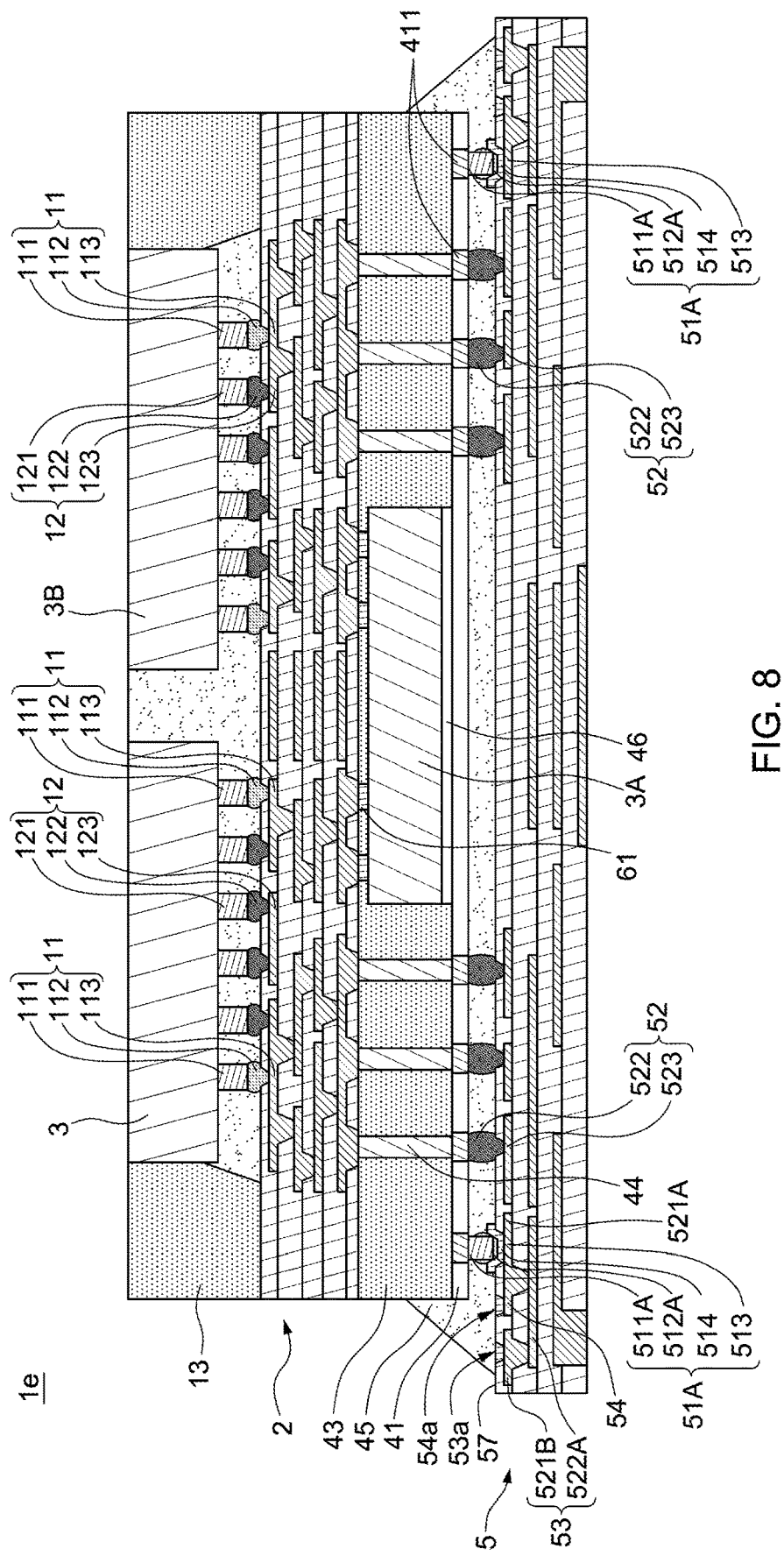
FIG. 8 illustrates a cross-sectional view of a package structure according to some embodiments of the present disclosure.

FIG. 8 illustrates a cross-sectional view of a package structure 1e according to some embodiments of the present disclosure. The package structure 1e includes a first wiring structure 2, a first electronic device 3, a second electronic device 3B, a lower electronic device 3A, a substrate structure 5, at least one first joint structure 11, at least one second joint structure 12, an encapsulant 13, an underfill 15, a first conductive path 53, a second conductive path 54, a second wiring structure 41, a molding compound 43, an underfill 45, and at least two bonding structures 51A, 52. In some embodiments, the first wiring structure 2, the first electronic device 3, the second electronic device 3B, the lower electronic device 3A, the substrate structure 5, the first joint structure 11, the second joint structure 12, the encapsulant 13, the underfill 15, the second wiring structure 41, the molding compound 43 and the underfill 45 are similar to those shown in previous drawing (e.g., FIG. 1A, FIG. 2, FIG. 4A, FIG. 5 and FIG. 7), and the details of which are omitted hereinafter.

In some embodiments, as shown in FIG. 8, the first bonding structure 51A includes a first bonding bump 511A disposed on the bonding pad 411, a first bonding pad 513 disposed in the substrate structure 5, and a first bonding solder 512A disposed between the first bonding pad 513 and the first bonding bump 511A. In some embodiments, the first bonding structure 51A may further include a first bonding layer 514 between the first bonding pad 513 and the first bonding solder 512A. In some embodiments, the first bonding bump 511A, the first bonding solder 512A, the first bonding layer 514, and/or the first bonding pad 513 includes the first bonding material, and the second bonding solder 522 and/or the second bonding pad 523 includes the second bonding material. In some embodiments, a bonding pad (e.g., the first bonding pad 513) of the first bonding structure 51A is disposed on a side of the second wiring structure 41 opposite to the lower electronic device 3A.

In some embodiments, as shown in FIG. 8, the first bonding structure 51A and the second bonding structure 52 have different structures. For example, the second bonding structure 52 does not include a bonding bump between the second bonding solder 522 and the bonding pad 411. In some embodiments, the first bonding solder 512A and the second bonding solder 522 have different shapes. The detailed structure of the first bonding structure 51A is similar to that of the first joint structure 11A of FIG. 4A and FIG. 5, and the details are omitted hereinafter.

In some embodiments, the first bonding material of the first bonding bump 511A may be or include a gold-tin (AuSn) alloy. In some embodiments, the first bonding material of the first bonding layer 514 may be or include a gold-tin (AuSn) alloy. In some embodiments, the first bonding solder 512A and the second bonding solder 522 may both be or include tin (Sn).

In some embodiments, as shown in FIG. 8, the substrate structure 5 includes two conductive paths (e.g., a first conductive path 53 and a second conductive path 54) respectively connected to an end 53a of a conductive via and an end 54a of a conductive via, the end 53a and the end 54a are exposed from a surface 57 (also referred to as "an upper surface") of the substrate structure 5, and the first conductive path 53 and the second conductive path 54 are both connected to the first bonding pad 513. In some embodiments, the first conductive path 53 includes an inner via connected to the first bonding pad 513, a circuit layer 522A, a circuit layer 521B, and an inner via connecting the circuit layer 522A to the circuit layer 521B. In some embodiments, the second conductive path 54 includes a circuit layer 521A. In some embodiments, the first conductive path 53 and the second conductive path 54 physically contact the first bonding pad 513.

FIG. 9A, FIG. 9B, FIG. 9C and FIG. 9D illustrate top views of portions of various package structures according to some embodiments of the present disclosure. It is to be noted that several elements are omitted in these drawings to more clearly illustrate the features of the present embodiments.

Figure 9B:
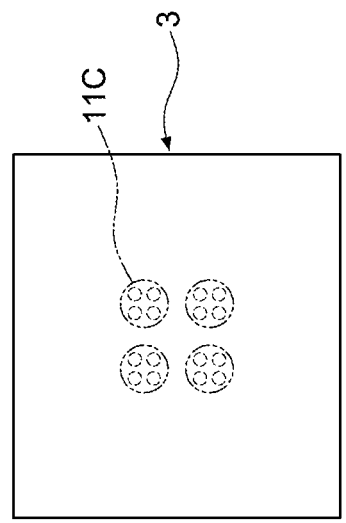
FIG. 9B illustrates a top view of a portion of a package structure according to some embodiments of the present disclosure.
Figure 9A:
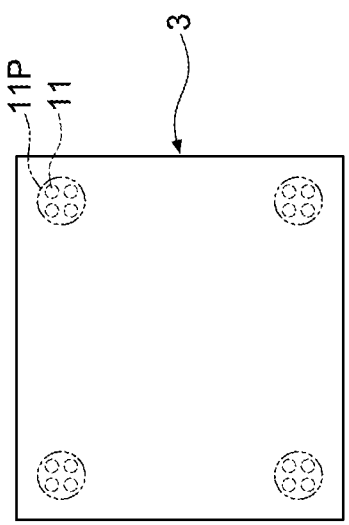
FIG. 9A illustrates a top view of a portion of a package structure according to some embodiments of the present disclosure.

As shown in FIG. 9A, in some embodiments, the package structure may include a plurality of the first joint structures 11, and the first joint structures 11 may be located corresponding to a peripheral region of the first electronic device 3 from a top view. In some embodiments, also referring to, for example, FIG. 1A, the first bump 111 may be located corresponding to a peripheral region of the electronic device 3 from a top view. In some embodiments, also referring to, for example, FIG. 1A, the first solder 112 may be located corresponding to a peripheral region of the electronic device 3 from a top view. In some embodiments, also referring to, for example, FIG. 1A, the first pad 113 may be located corresponding to a peripheral region of the electronic device 3 from a top view.

In some embodiments, as shown in FIG. 9A, the first joint structures 11 may be located in regions 11P adjacent to the corners of the first electronic device 3 from a top view. In some embodiments, the second joint structures 12 may be located in some regions other than the regions 11P. For example, the second joint structures 12 may be located between the regions 11P. In some embodiments, each region 11P may be disposed with four or more first joint structures 11.

As shown in FIG. 9B, in some embodiments, the first joint structures 11 may be located corresponding to a central region of the first electronic device 3 from a top view. For example, the first joint structures 11 may be located in regions 11C adjacent to the center of the first electronic device 3 from a top view. In some embodiments, the second joint structures 12 may be located in some regions other than the region 11C. For example, the second joint structures 12 may be located corresponding to a peripheral region of the first electronic device 3 from a top view. In some embodiments, each region 11C may be disposed with four or more first joint structures 11.

Figure 9D:
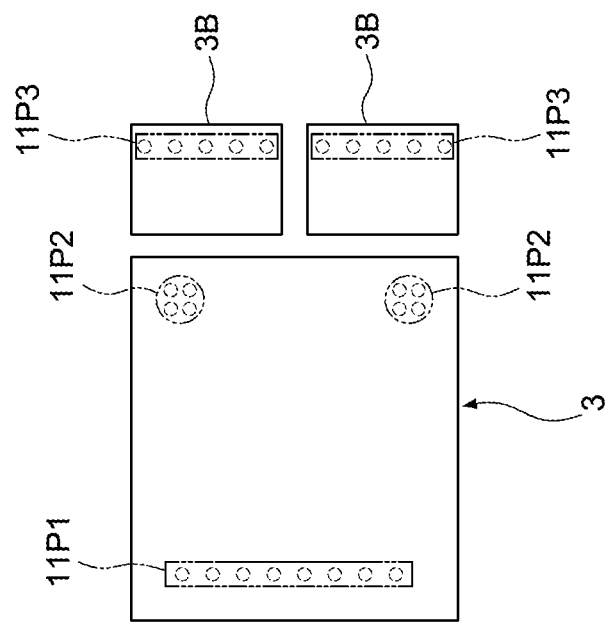
FIG. 9D illustrates a top view of a portion of a package structure according to some embodiments of the present disclosure.
Figure 9C:
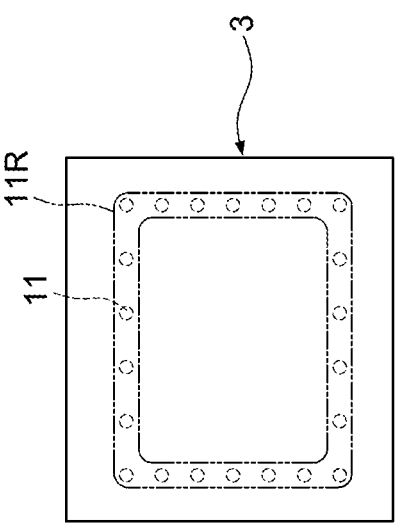
FIG. 9C illustrates a top view of a portion of a package structure according to some embodiments of the present disclosure.

As shown in FIG. 9C, in some embodiments, the first joint structures 11 may be located corresponding to a peripheral region of the first electronic device 3 from a top view. For example, the first joint structures 11 may be located in a region 11R which corresponds to the peripheral region and surrounds the central region of the first electronic device 3.

In some embodiments, the second joint structures 12 may be located in the central region of the first electronic device 3 and surrounded by the first joint structures 11 from a top view. In some embodiments, the region 11R may be disposed with ten or more first joint structures 11.

As shown in FIG. 9D, in some embodiments, the first joint structures 11 may be located corresponding to a region including a power pad and/or a ground pad of the first electronic device 3. In some embodiments, the first joint structures 11 may be located in the region 11P1 which is corresponding to a peripheral region of the first electronic device 3 and includes a power pad and/or a ground pad. Since I/O counts are higher in the region including a power pad and/or a ground pad, the first joint structures 11 located in the region 11P1 may further balance the stress and reduce the warpage level.

In some embodiments, as shown in FIG. 9D, the package structure may further include one or more second electronic devices 3B disposed adjacent to a lateral side of the first electronic device 3, and the region 11P1 including a power pad and/or a ground pad is opposite the lateral side adjacent to the second electronic devices 3B. In some embodiments, the first joint structures 11 may be further located in a region 11P2 corresponding to the peripheral region of the first electronic device 3 and opposite the region 11P1, and the second electronic devices 3B are disposed adjacent to the region 11P2. In some embodiments, a number of the first joint structures 11 in the regions 11P2 may be less than a number of the first joint structures 11 in the region 11P1.

In some embodiments, as shown in FIG. 9D, the first joint structures 11 may be located corresponding to a peripheral region of a combination of the first electronic device 3 and the second electronic device 3B. In some embodiments, the first joint structures 11 may be located in a region 11P1 adjacent to a lateral side of the first electronic device 3 and in regions 11P3 adjacent to lateral sides of second the electronic device 3B from a top view. In some embodiments, the first bump 111 may be located corresponding to a peripheral region of a combination of the first electronic device 3 and the second electronic device 3B. In some embodiments, the first solder 112 may be located corresponding to a peripheral region of a combination of the first electronic device 3 and the second electronic device 3B. In some embodiments, the first pad 113 may be located corresponding to a peripheral region of a combination of the first electronic device 3 and the second electronic device 3B.

FIG. 10A, FIG. 10B, FIG. 10C, FIG. 10D, FIG. 10E and FIG. 10F illustrate various stages of a method of manufacturing a package structure 1 according to some embodiments of the present disclosure.

Figure 10A:
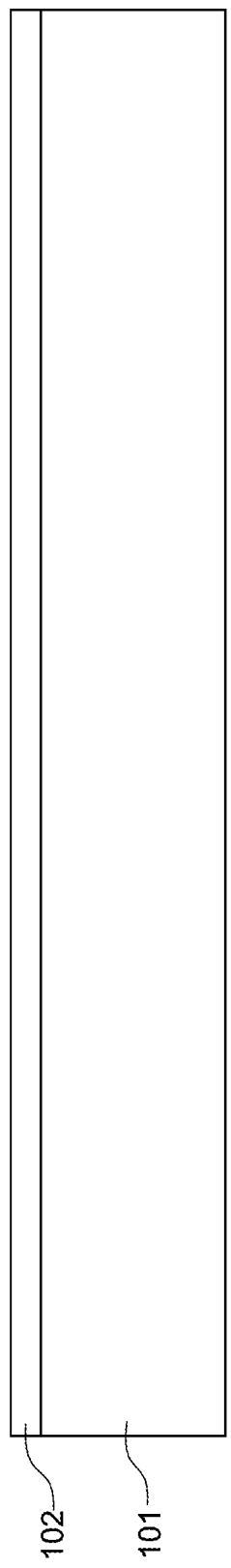
FIG. 10A, FIG. 10B, FIG. 10C, FIG. 10D, FIG. 10E and FIG. 10F illustrate various stages of a method of manufacturing a package structure according to some embodiments of the present disclosure.

Referring to FIG. 10A, a carrier 101 is provided, and a release layer 102 is formed on the carrier 101.

Figure 10B:
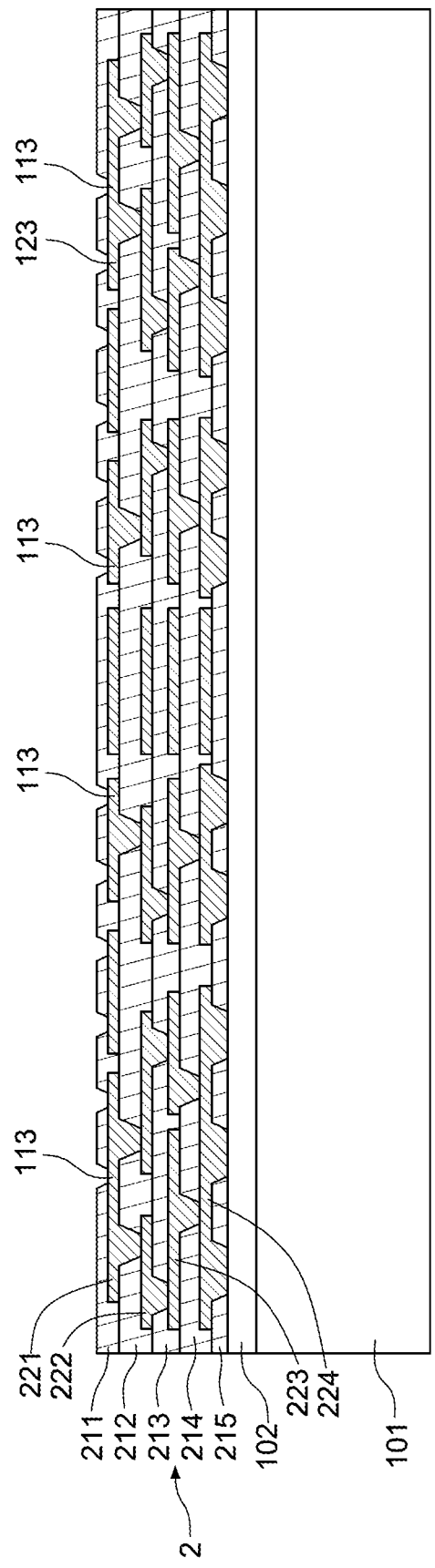

Referring to FIG. 10B, a first wiring structure 2 is formed or provided on the release layer 102. In some embodiments, the first wiring structure 2 may be formed by forming a plurality of dielectric layers, a plurality of inner vias in the dielectric layers, and a plurality of circuit layer between the dielectric layers and connected to the corresponding inner vias. For example, a dielectric layer 215 may be formed on the release layer 102, inner vias may be formed in the dielectric layer 215, and a circuit layer 224 may be formed on the dielectric layer 215 and connected to the inner vias, so as to form a redistribution layer of the first wiring structure 2. In the embodiments, the first wiring structure 2 may be formed by repeating the operation of forming the above dielectric layer 215, the inner vias and the circuit layer 224. In the embodiments, the first pad 113 and the second pad 123 are portions of the circuit layer 221.

Figure 10C:
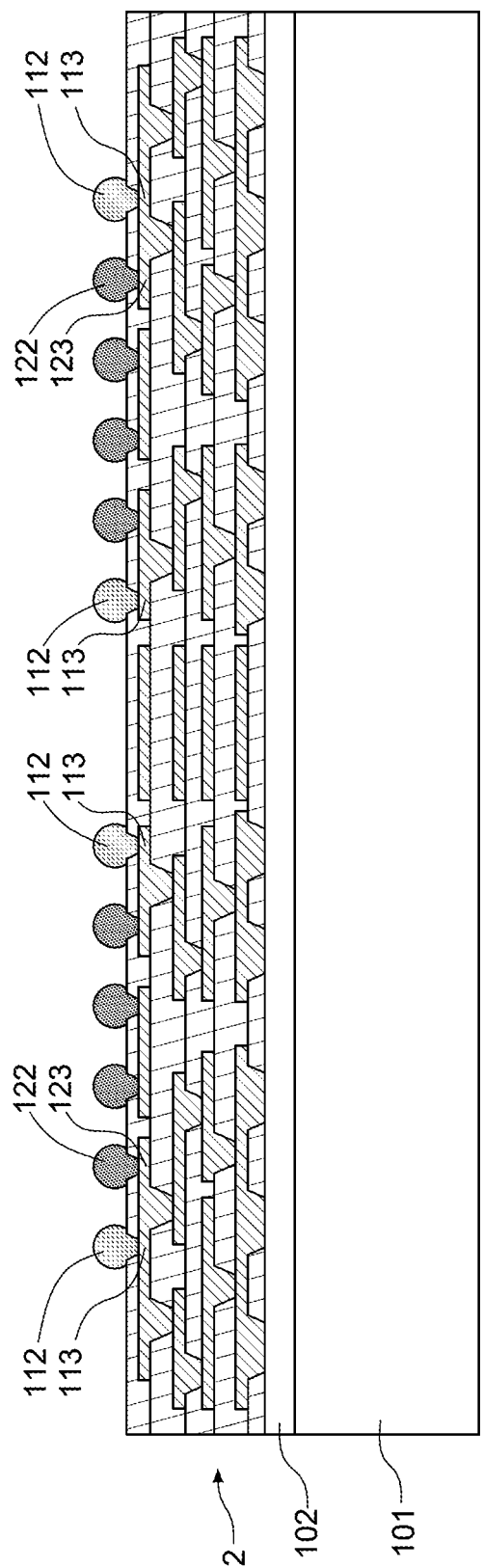

Referring to FIG. 10C, one or more first solders 112 are formed on the first pads 113, and one or more second solders 122 are formed on the second pads 123. In some embodiments, the first solder 112 includes a first material, and the second solder 122 includes the second material. In some embodiments, the first material of the first solder 112 may be or include silver (Ag) paste, copper (Cu) paste, or a combination thereof, and the second material of the second solder 122 may be or include tin (Sn). A melting point of the first material the first solder 112 may be higher than the second material of the second solder 122.

Figure 10D:
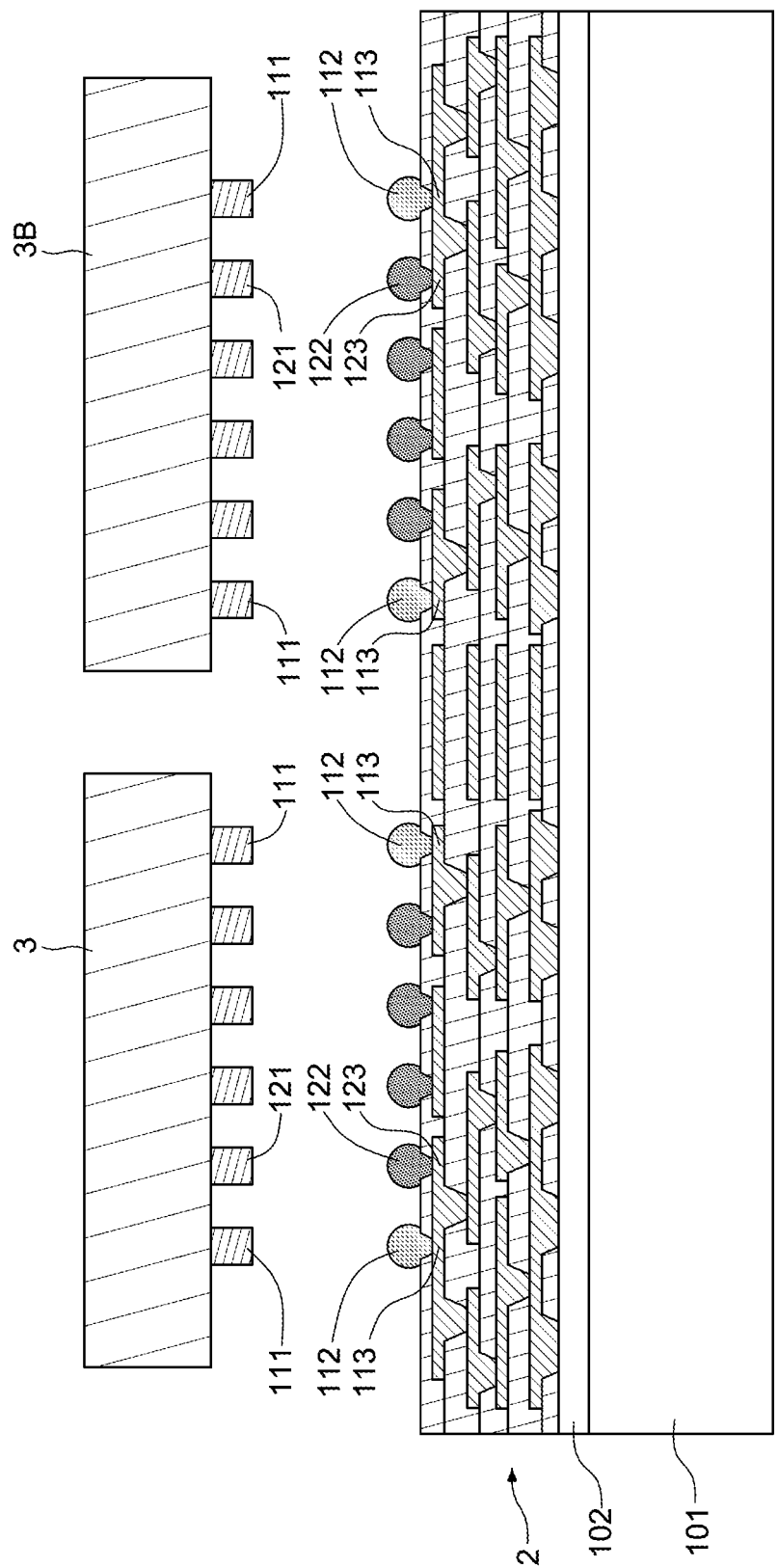

Referring to FIG. 10D, at least one electronic device (e.g., the first electronic device 3 and/or the second electronic device 3B) is provided. In some embodiments, the electronic device (e.g., the first electronic device 3 and/or the second electronic device 3B) may include one or more first bumps 111 and one or more second bumps 121.

Figure 10E:
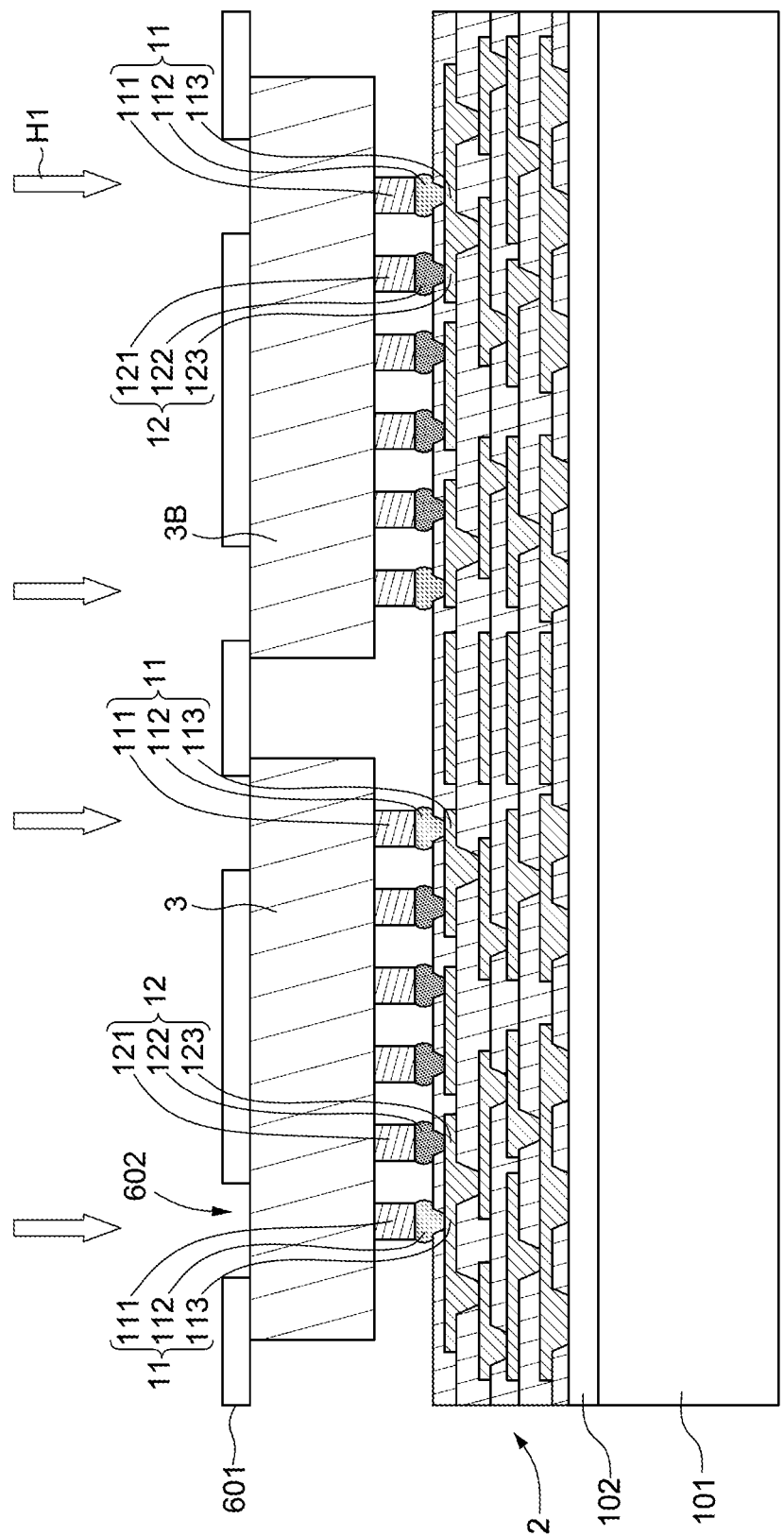

Referring to FIG. 10E, the electronic device (e.g., the first electronic device 3 and/or the second electronic device 3B) is bonded to the first wiring structure 2 through one or more first joint structures 11 under a first temperature. In some embodiments, the electronic device (e.g., the first electronic device 3 and/or the second electronic device 3B) is disposed on the first wiring structure 2, and a first heating process H1 is conducted to form one or more first joint structures 11. In the embodiments, the first bump 111 contacts the first solder 112, and the second bump 121 contacts the second solder 122. In some embodiments, the first heating process H1 is conducted on the first bump 111, the first solder 112, and the first pad 113. In some embodiments, the first heating process H1 is conducted under the first temperature. In some embodiments, the first temperature is higher than the melting point of the second bump 121, the melting point of the second solder 122, and the melting point of the second pad 123. In some embodiments, the first heating process H1 is conducted under the first temperature that is higher than about 270° C. In some embodiments, the first heating process H1 is conducted by a laser technique to melt the first solder 112. In some embodiments, after the first heating process H1 is conducted, the at least one first joint structure 11 is formed, while the second joint structure 12 is not formed yet.

In some embodiments, a mask 601 is arranged to define at least one opening 602 corresponding to a predetermined position of the to-be-formed first joint structure 11. In some embodiments, the mask 601 defines one or more openings 602 that correspond to the first bump 111, the first solder 112, and the first pad 113 from a top view. In some embodiments, the opening 602 is disposed right above the first bump 111, the first solder 112, and the first pad 113. In some embodiments, the first heating process is conducted through the opening 602. In some embodiments, the first heating process H1 is conducted through the opening 602 on the first bump 111, the first solder 112, and the first pad 113. In some embodiments, the mask 601 may prevent the first heating process H1 from being conducted on the second bump 121, the second solder 122, and the second pad 123. In some embodiments, the mask 601 may be or include stainless steel.

Figure 10F:
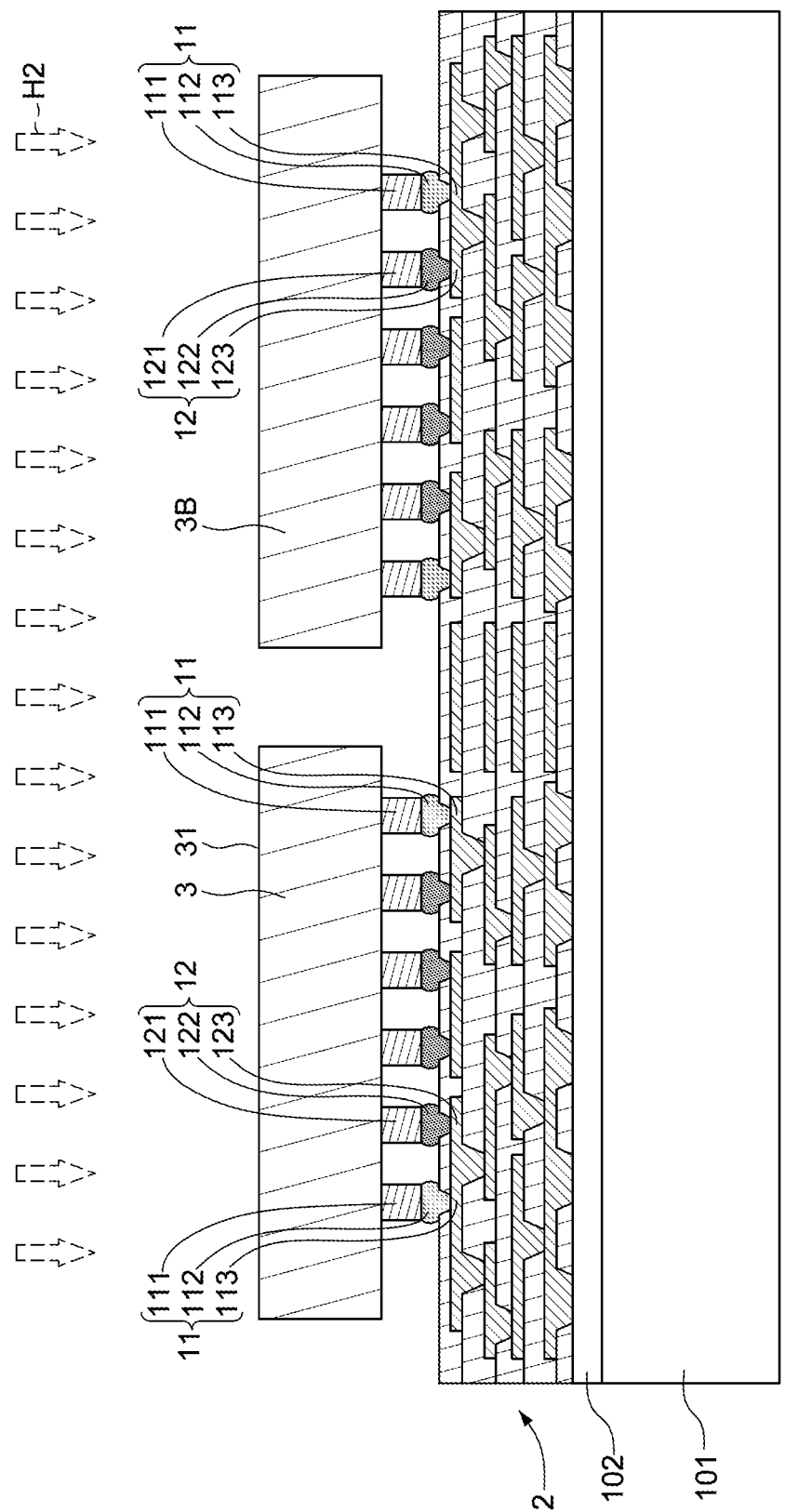

Referring to FIG. 10F, the electronic device (e.g., the first electronic device 3 and/or the second electronic device 3B) is bonded to the first wiring structure 2 through one or more second joint structures 12 under a second temperature. In some embodiments, a second heating process H2 is conducted to form one or more second joint structures 12. In some embodiments, the second heating process H2 is conducted after the mask 601 is removed. In some embodiments, the first temperature of the first heating process H1 is higher than the second temperature of the second heating process H2. In some embodiments, the second heating process H2 is conducted under the second temperature that is lower than the melting point of the first bump 111, the melting point of the first solder 112, and/or the melting point of the first pad 113. In some embodiments, the second heating process H2 is conducted after conducting the first heating process H1. In some embodiments, the second heating process H2 is conducted for a longer time period than that of the first heating process H1. In some embodiments, the second heating process H2 is conducted by a mass reflow process to melt the second solder 122. It is noted that the first joint structure 11 remains in a solid state under the second temperature. As such, the electronic device (e.g., the first electronic device 3 and/or the second electronic device 3B) is bonded to the first wiring structure 2. Then, the carrier 101 and the release layer 102 are removed. Then, a singulation process is conducted so as to obtain the package structure 1 shown in FIG. 1A.

According to some embodiments of the present disclosure, the first wiring structure 2 and the electronic device (e.g., the first electronic device 3 and/or the second electronic device 3B) are bonded together by utilizing two different heating temperatures to form two different joint structures (e.g., the first joint structure 11 and the second joint structure 12) between the first wiring structure 2 and the electronic device (e.g., the first electronic device 3 and/or the second electronic device 3B) in two different steps. As such, after the first joint structure 11 having a higher melting point is formed on chosen local regions, the relative position between the first wiring structure 2 and the electronic device (e.g., the first electronic device 3 and/or the second electronic device 3B) can be stably fixed. Then the second joint structure 12 can be formed under a relatively lower temperature performed for a relatively longer time, which facilitates the formation of intermetallic compound (IMC), such that the overall bonding strength of the package structure 1 can be increased.

In addition, according to some embodiments of the present disclosure, the laser process in the first heating process H1 provides a relatively high heat, high precision and a relatively short processing time, and the following mas reflow process in the second heating process H2 can be conducted for a relatively long time to significantly increase the structural strength of the first joint structure 11.

Moreover, according to some embodiments of the present disclosure, the first heating process H1 is only performed on local regions, despite the first temperature of the first heating process H1 is higher than the second temperature of the second heating process H2, the heat applied in the first heating process H1 is still relatively low and thus does not cause serious warpage and/or shrinkage to the first wiring structure 2 and/or the electronic device (e.g., the first electronic device 3 and/or the second electronic device 3B). Accordingly, the precision of the alignment of the bonding process is not affected while the joint strength still can be increased.

Furthermore, according to some embodiments of the present disclosure, the first joint structure 11 does not melt or deform when the second heating process H2 is conducted, such that the size of the space between the first wiring structure 2 and the electronic device (e.g., the first electronic device 3 and/or the second electronic device 3B) (also referred to as "a die gap") is not affected by the second heating process H2, the overall structure of the package structure 1 is stable, and the quality of the as-formed package structure 1 is further improved.

Figure 11A:
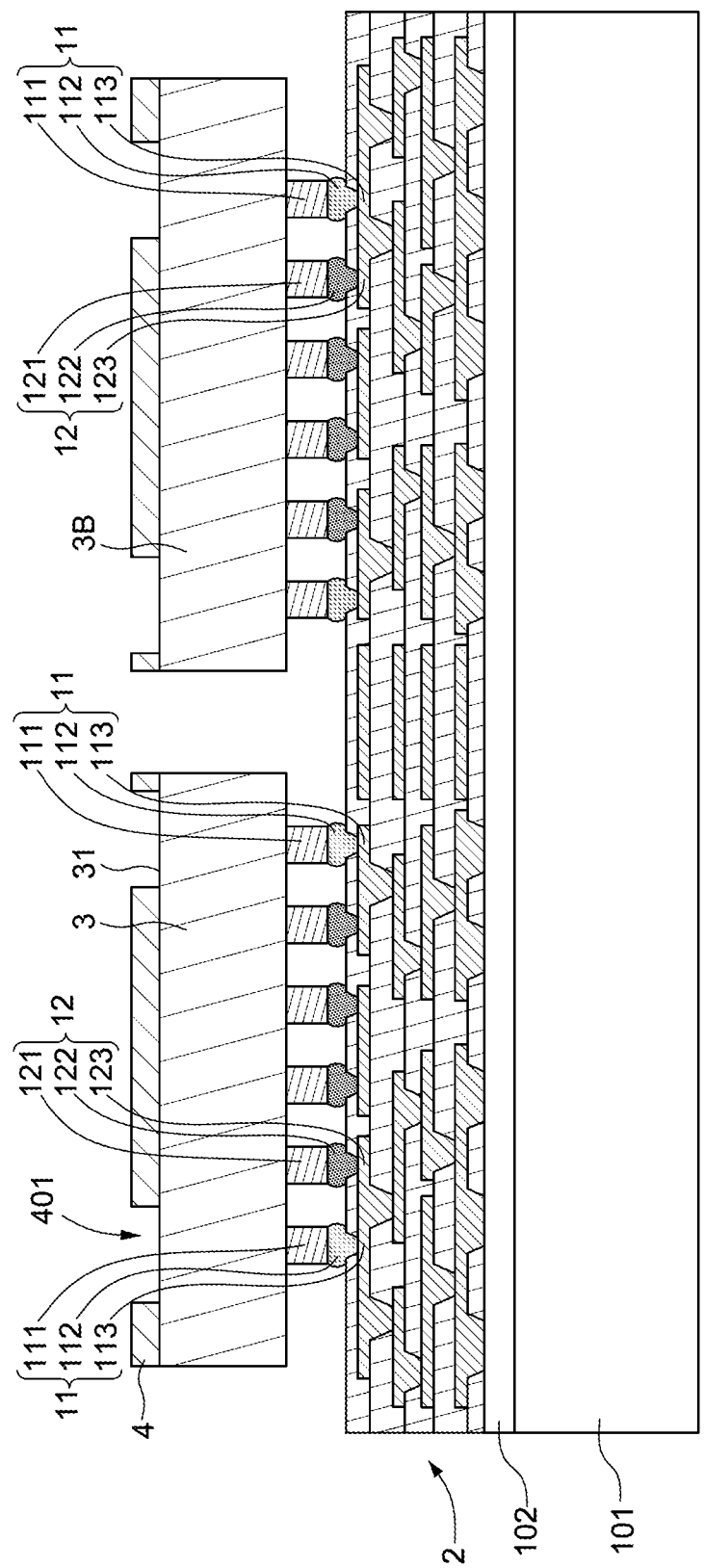
FIG. 11A, FIG. 11B and FIG. 11C illustrate various stages of a method of manufacturing a package structure according to some embodiments of the present disclosure.
Figure 11B:
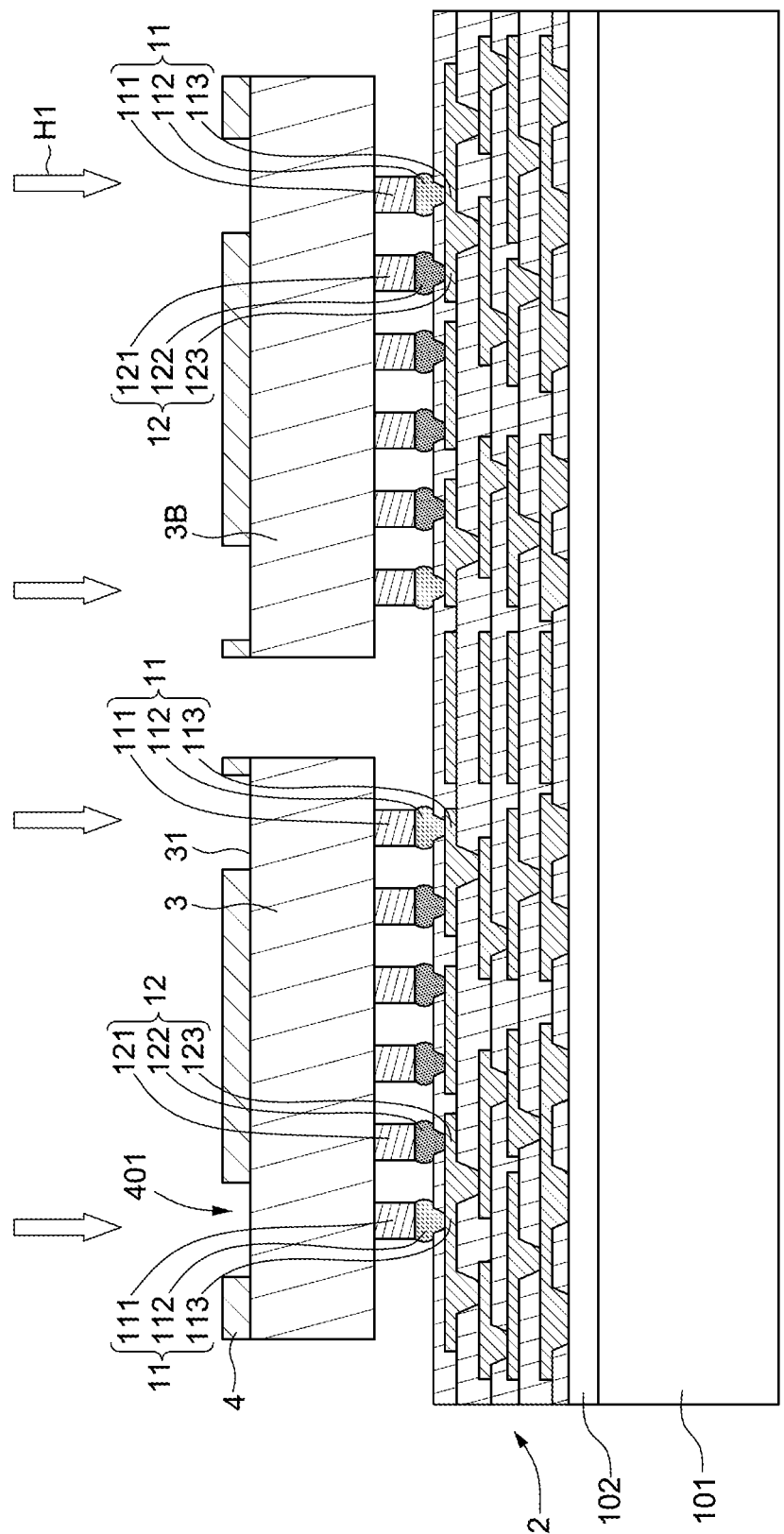
Figure 11C:
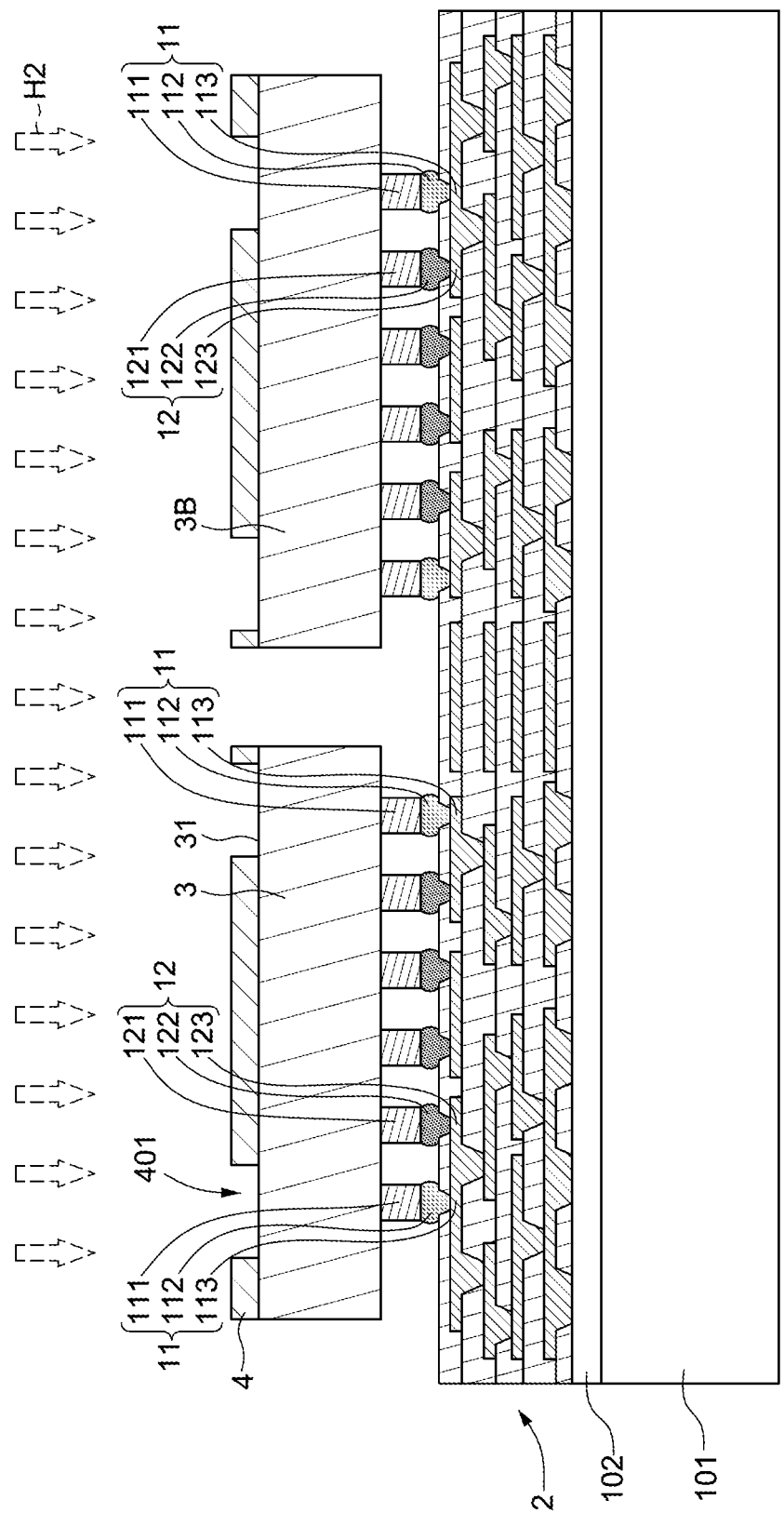

FIG. 11A, FIG. 11B and FIG. 11C illustrate various stages of a method of manufacturing a package structure 1a according to some embodiments of the present disclosure.

First, operations as illustrated in FIGS. 10A-10D are performed. Next, referring to FIG. 11A, the electronic device (e.g., the first electronic device 3 and/or the second electronic device 3B) is disposed on the first wiring structure 2.

Next, still referring to FIG. 11A, a patterned mask layer 4 is formed on the electronic device (e.g., the first electronic device 3 and/or the second electronic device 3B). In some embodiments, the patterned mask layer 4 has one or more openings 401 to expose the first bump 111, the first solder 112 and the first pad 113 from a top view. In some embodiments, the patterned mask layer 4 directly contacts the surface 31 of the first electronic device 3 (and/or the upper surface of the second electronic device 3B).

Referring to FIG. 11B, operations similar to those illustrated in FIG. 10E may be performed on the first bump 111, the first solder 112 and the first pad 113. In some embodiments, the first heating process H1 is conducted on the first bump 111, the first solder 112 and the first pad 113 through the opening 401 of the patterned mask layer 4. The patterned mask layer 4 prevents the first heating process H1 from being conducted on the second pad 121, the second solder 122, and the second pad 123. In some embodiments, the first heating process H1 is conducted by a laser technique to melt the first solder 112.

Referring to FIG. 11C, operations similar to those illustrated in FIG. 10F may be performed on the second pad 121, the second solder 122, and the second pad 123. In some embodiments, the second heating process H2 is conducted after conducting the first heating process H1. In some embodiments, the second heating process H2 is conducted by a mass reflow process to melt the second solder 122. It is noted that the first joint structure 11 remains in a solid state under the second temperature. As such, the electronic device (e.g., the first electronic device 3 and/or the second electronic device 3B) is bonded to the first wiring structure 2, and then the package structure 1a shown in FIG. 3 may be formed. In some embodiments, a grounding process performed on the encapsulant 13 may expose the first electronic device 3 and also remove the patterned mask layer 4, so as to form the package structure 1 shown in FIG. 1A.

FIG. 12A, FIG. 12B, FIG. 12C, FIG. 12D, FIG. 12E, FIG. 12F, FIG. 12G, FIG. 12H, FIG. 12I and FIG. 12J illustrate various stages of a method of manufacturing a package structure according to some embodiments of the present disclosure.

Figure 12A:
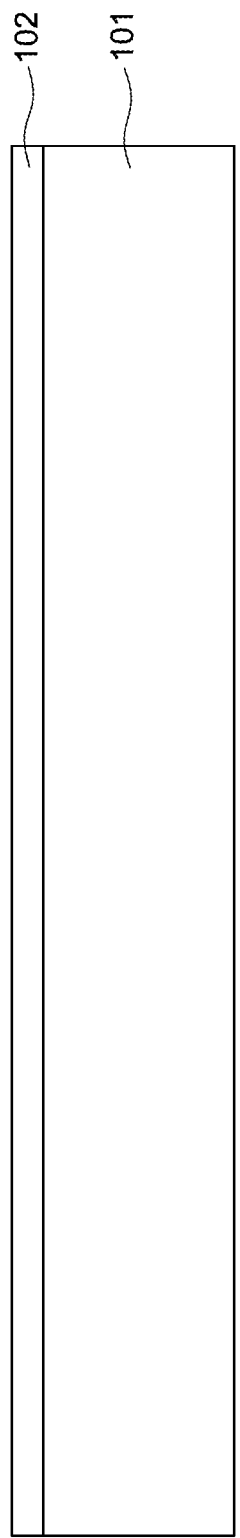
FIG. 12A, FIG. 12B, FIG. 12C, FIG. 12D, FIG. 12E, FIG. 12F, FIG. 12G, FIG. 12H, FIG. 12I and FIG. 12J illustrate various stages of a method of manufacturing a package structure according to some embodiments of the present disclosure.

Referring to FIG. 12A, a carrier 101 is provided, and a release layer 102 is formed on the carrier 101.

Figure 12B:
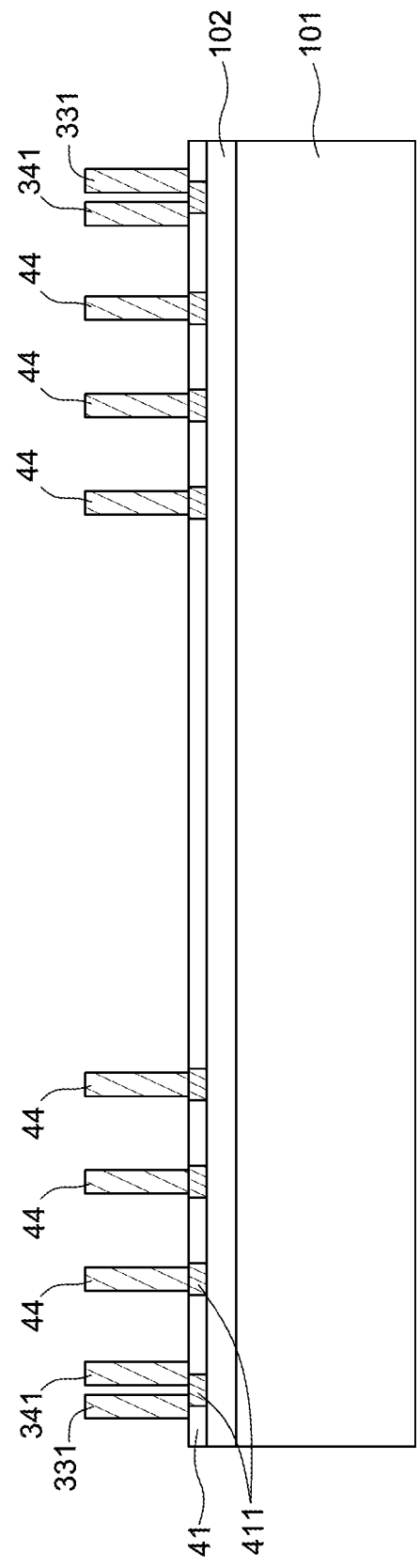

Referring to FIG. 12B, a second wiring structure 41 is formed on the release layer 102, and a plurality of conductive pillars 44, 331 and 341 are formed on the second wiring structure 41. In some embodiments, a plurality of bonding pads 411 are formed in the second wiring structure 41, and the conductive pillars 44, 331 and 341 are connected to the bonding pads 411.

Figure 12C:
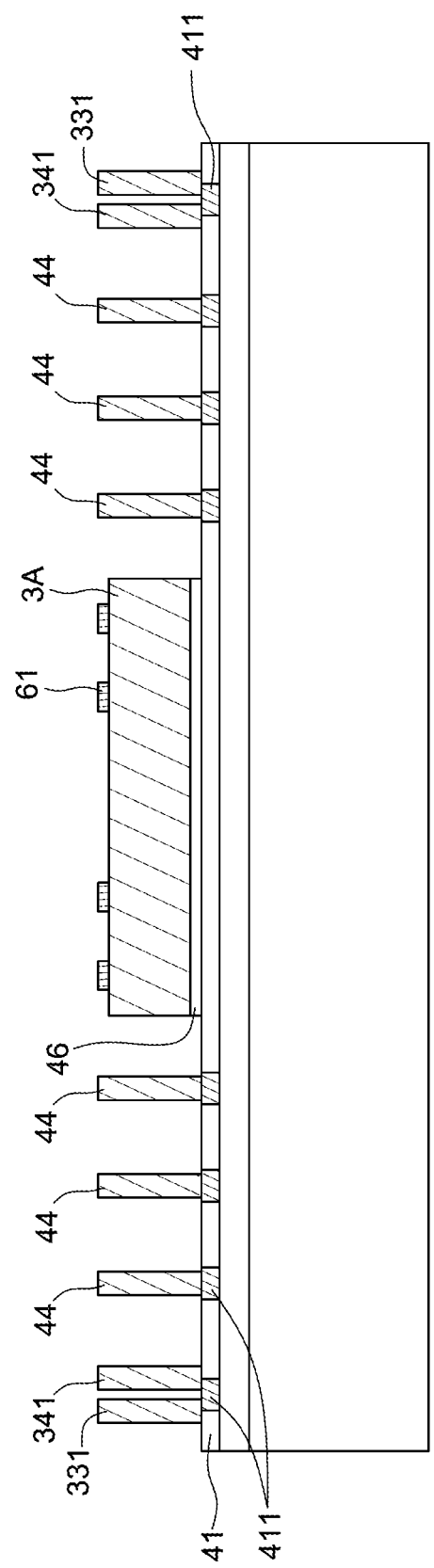

Referring to FIG. 12C, a lower electronic device 3A is disposed on the second wiring structure 41. In some embodiments, the lower electronic device 3A is attached to the second wiring structure 41 through an adhesion layer 46. The lower electronic device 3A may include one or more conductive bumps 61.

Figure 12D:
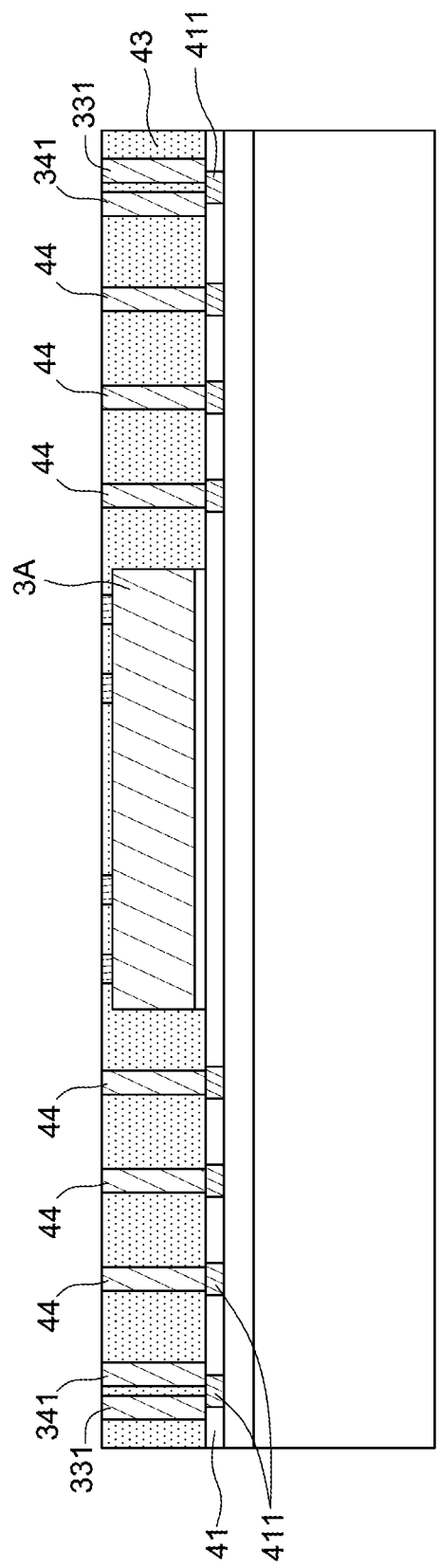

Referring to FIG. 12D, a molding compound 43 is formed to encapsulate the lower electronic device 3A. In some embodiments, the molding compound 43 encapsulates the conductive pillars 44, 331 and 341 and the conductive bumps 61.

Figure 12E:
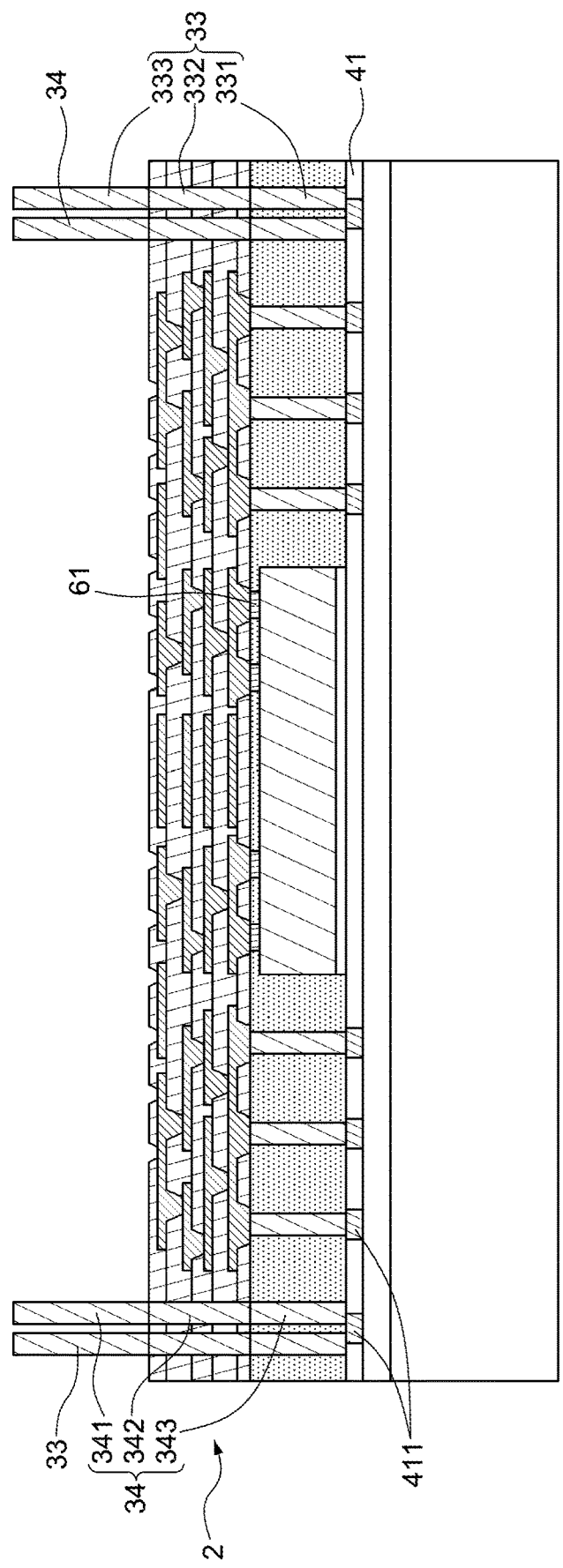

Referring to FIG. 12E, a first wiring structure 2 is formed or disposed on the molding compound 43 to electrically connect the first wiring structure 2 to the second wiring structure 41. In some embodiments, the first wiring structure 2 may be formed by operations similar to those illustrated in FIG. 10B. For example, a dielectric layer 215 may be formed on the molding compound 43 and the lower electronic device 3A, inner vias may be formed in the dielectric layer 215 and on the conductive bumps 61 and the conductive pillars 44, and a circuit layer 224 may be formed on the dielectric layer 215 and connected to the inner vias, so as to form a redistribution layer of the first wiring structure 2. The first wiring structure 2 may be formed by repeating the operation of forming the above dielectric layer 215, the inner vias and the circuit layer 224. In some other embodiments, the first wiring structure 2 may be formed in advance, and then a bonding process may be performed by connecting some of the exposed inner vias of the first wiring structure 2 to the conductive pillars 44 and the conductive bumps 61. In some embodiments, conductive pillars 332 and 342 are formed in the first wiring structure 2, and the conductive pillars 332 and 342 are respectively connected to the conductive pillars 331 and 342. Next, in some embodiments, conductive pillars 333 and 334 are respectively formed on the conductive pillars 332 and 342. As such, a first electrical path 33 including the conductive pillars 331, 332 and 333 is formed, and a second electrical path 34 including the conductive pillars 341, 342 and 343 is formed.

Figure 12F:
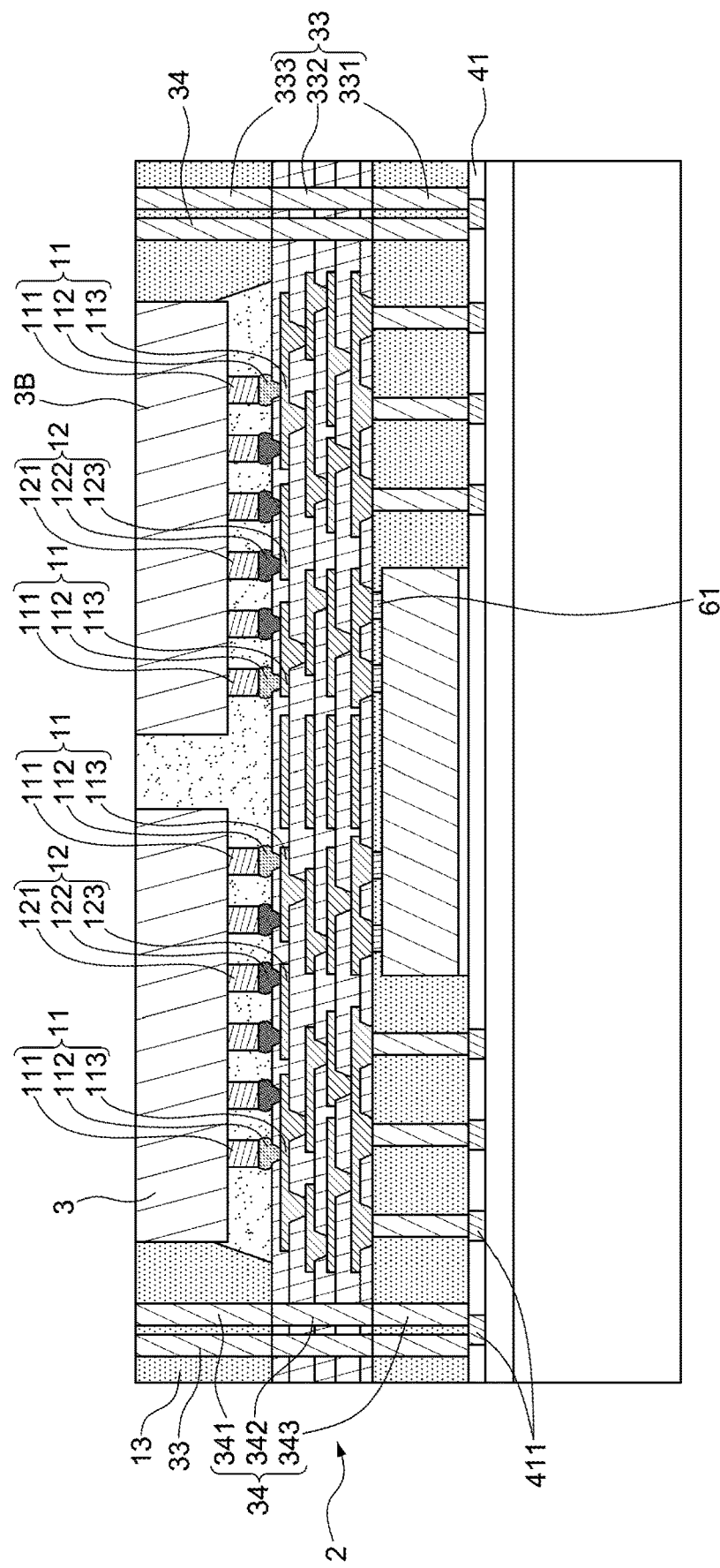

Referring to FIG. 12F, at least one electronic device (e.g., the first electronic device 3 and/or the second electronic device 3B) is provided, and the electronic device (e.g., the first electronic device 3 and/or the second electronic device 3B) is bonded to the first wiring structure 2 through at least two joint structures (e.g., the first joint structure 11 and the second joint structure 12). In some embodiments, the electronic device (e.g., the first electronic device 3 and/or the second electronic device 3B) is bonded to the first wiring structure 2 by operations similar to those illustrated in FIGS. 10E-10F or FIGS. 11B-11C, and the details are omitted hereinafter.

Still referring to FIG. 12F, an encapsulant 13 is formed to encapsulate the electronic device (e.g., the first electronic device 3 and/or the second electronic device 3B) and the conductive pillars 333 and 343. As such, the as-formed first electrical path 33 and the second electrical path 34 extend through the encapsulant 13, the first wiring structure 2, and the molding compound 43.

Figure 12G:
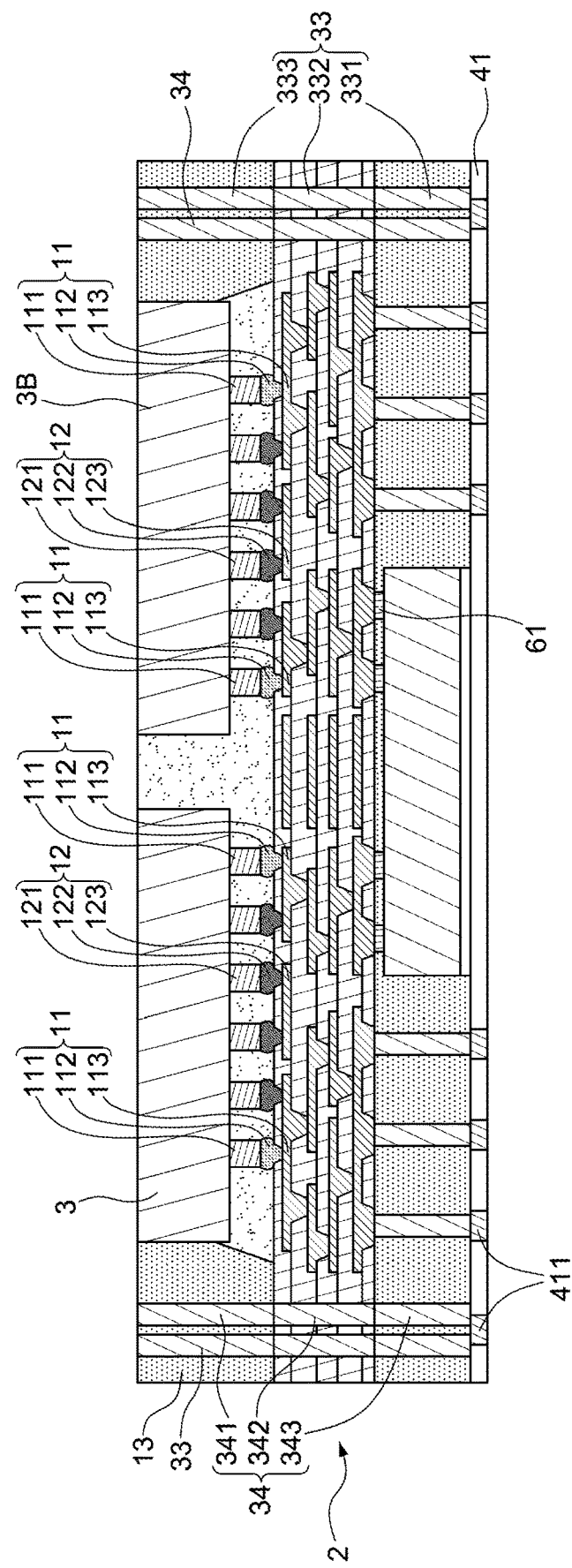

Referring to FIG. 12G, the carrier 101 and the release layer 102 are removed.

Figure 12H:
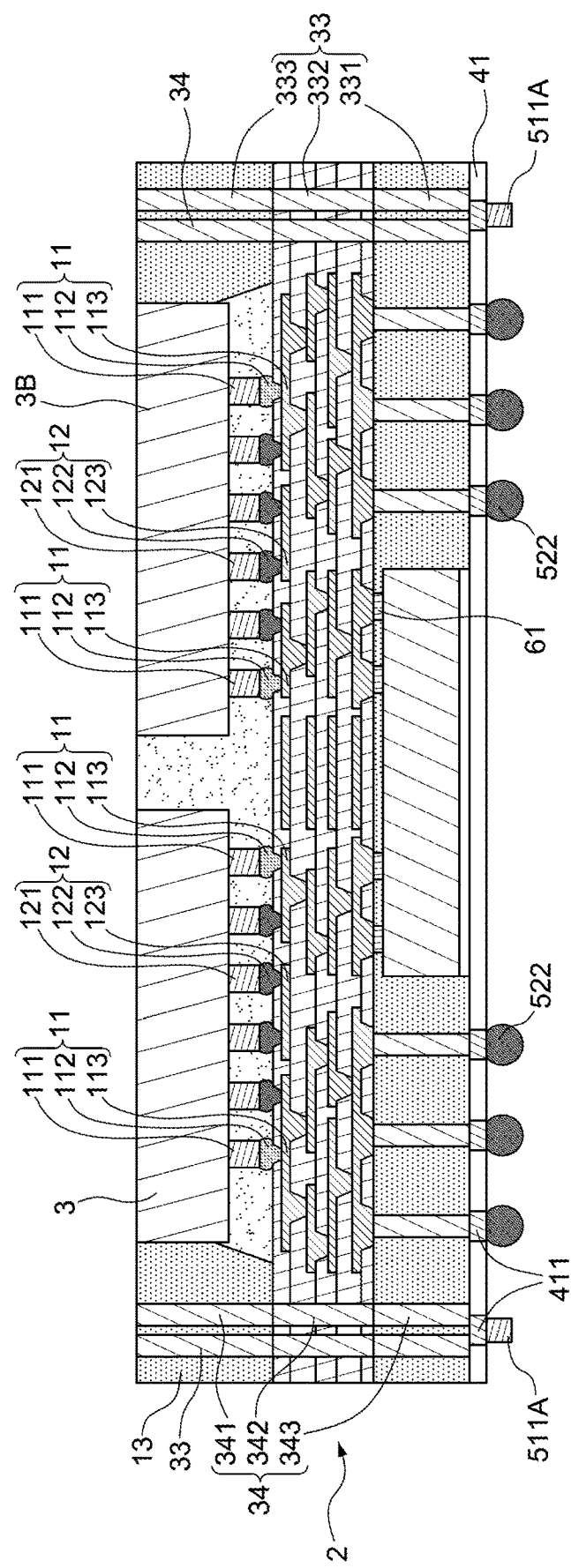

Referring to FIG. 12H, one or more first bonding bumps 511A and one or more second bonding solders 522 are formed on the bonding pads 411.

Figure 12I:
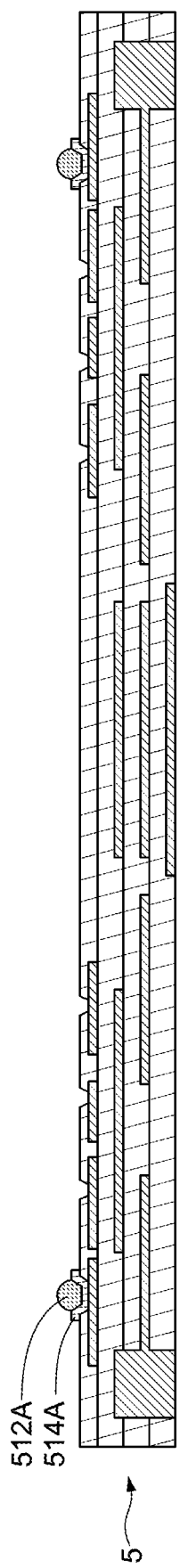

Referring to FIG. 12I, a substrate structure 5 is provided. In some embodiments, the substrate structure 5 may include a plurality of dielectric layer and a plurality of circuit layer. In some embodiments, the substrate structure 5 may be a substrate level conductive structure. In some embodiments, the substrate structure 5 may further include a core portion including Ajinomoto build-up film (ABF), bismaleimide-triazine (BT) or epoxy resin.

Still referring to FIG. 12I, one or more first bonding layers 514 are formed on the substrate structure 5, and one or more first bonding solders 512A may be formed on the first bonding layers 514. In some embodiments, the first bonding solders 512A may be omitted. In some embodiments, one or more first bonding pads 513 and one or more second bonding pads 523 are formed in the substrate structure 5. In some embodiments, the first bonding pad(s) 513 and the second bonding pad(s) 523 may be portions of one or more circuit layers in the substrate structure 5.

Figure 12J:
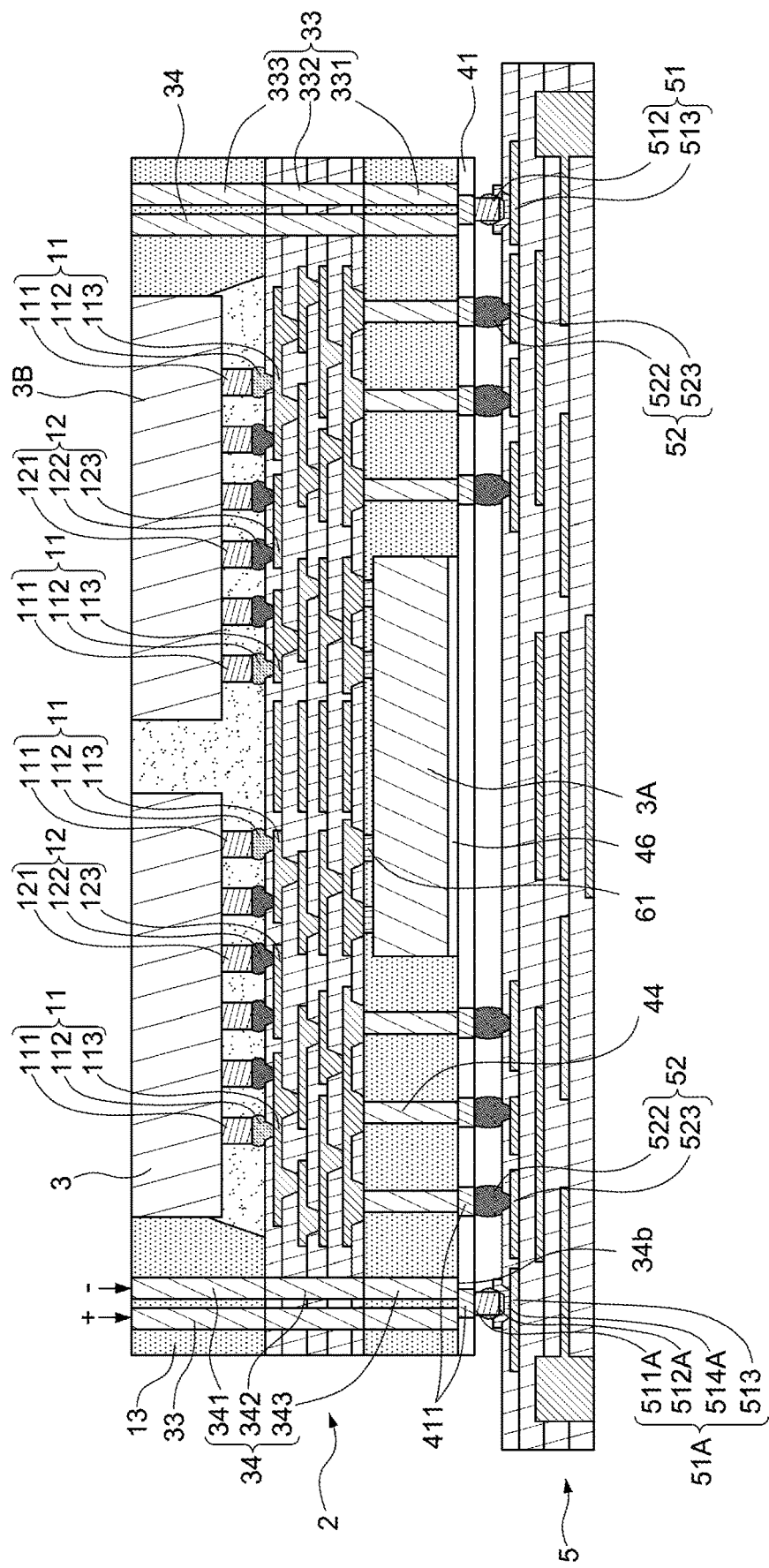

Referring to FIG. 12J, the second wiring structure 41 is bonded to the substrate structure 5. In some embodiments, the bonding pad 411 contacts the first bonding bump 511A, and the first bonding bump 511A contacts the first bonding solder 512A and the first bonding layer 514. In some embodiments, the bonding pad 411 contacts the second bonding solder 522, and the second bonding solder 522 contacts the second bonding pad 523. In some embodiments, a first bonding process is conducted to form one or more first bonding structures 51A, and a second bonding process is conducted to form one or more second bonding structures 52.

In some embodiments, the first bonding process is conducted by a welding technique. In some embodiments, a welding current is applied through the first electrical path 33 and the second electrical path 34 so as to provide heat to the bonding pad 411 and then to the first bonding bump 511A, the first bonding solder 512A, the first bonding layer 514, and the first bonding pad 513, so that the first bonding structure 51A is formed. In some embodiments, the welding current is applied on the end 33a and the end 34a. The predetermined location of the first bonding structure 51A is relatively distant from the surface 131 (also referred to as "the upper surface") of the encapsulant 13 with many intervening layers/structures therebetween, and providing heat to such location from outside, for example, applying laser from outside the encapsulant 13, can be very difficult. According to some embodiments of the present disclosure, the welding process conducted utilizing conductive paths (e.g., the first conductive path 33 and the second conductive path 34) extending through the package structure can effectively provide heat to the first bonding bump 511A, the first bonding solder 512A, the first bonding layer 514, and the first bonding pad 513, the bonding process can be made simple, and thus the yield of the manufacturing process of the package structure can be improved.

In some embodiments, the second bonding process is conducted after conducting the first bonding process. In some embodiments, the second bonding process is conducted by a mass reflow process. In some embodiments, a temperature of the first bonding process is higher than a temperature of the second bonding process. Then, an underfill 45 may be disposed in a space between the substrate structure 5 and the second wiring structure 41 to cover and protect the first bonding structure 51A and the second bonding structure 52. As such, a package structure having a structure similar to that of the package structure 1d shown in FIG. 7 except the first bonding structure 51 being replaced by the first bonding structure 51A shown in FIG. 8 may be formed.

Figure 13:
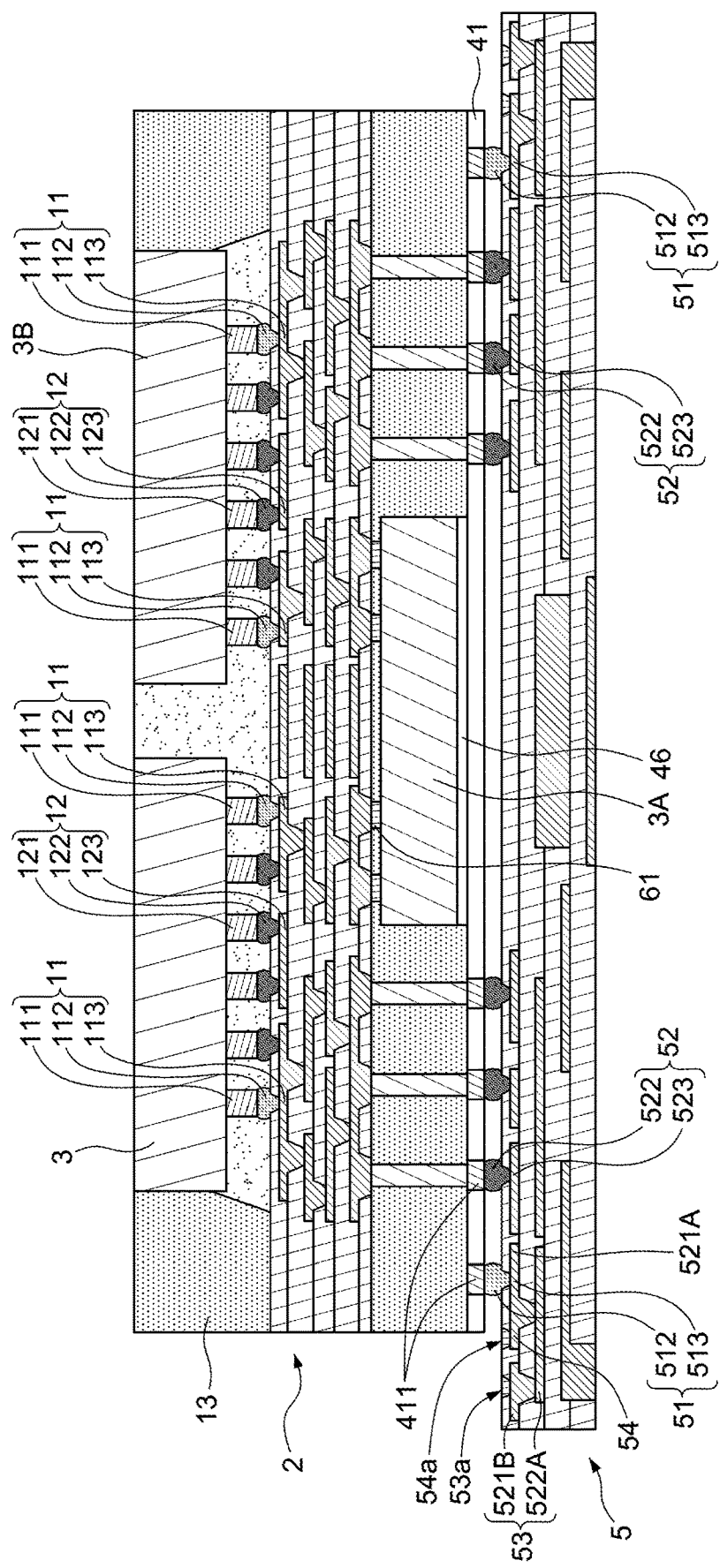
FIG. 13 illustrates an intermediate stage of a method of manufacturing a package structure according to some embodiments of the present disclosure.

FIG. 13 illustrates an intermediate stage of a method of manufacturing a package structure according to some embodiments of the present disclosure.

First, operations similar to those illustrated in FIGS. 12A-12H are performed, expect that the first electrical path 33 and the second electrical path 34 are omitted.

Next, referring to FIG. 13, a substrate structure 5 including a first conductive path 53 and a second conductive path 54 is provided. Then, the second wiring structure 41 is bonded to the substrate structure 5 by operations similar to those illustrated in FIG. 12J, except that the first bonding process in the present embodiment is different from that illustrated in FIG. 12J. In some embodiments, as shown in FIG. 13, the first bonding process is conducted by a welding technique. In some embodiments, a welding current is applied through the first conductive path 53 and the second conductive path 54 so as to provide heat to the first bonding solder 512 and the first bonding pad 513, so that the first bonding structure 51 is formed. In some embodiments, the welding current is applied on the end 53a and the end 54a.

Then, a second bonding process is conducted after conducting the first bonding process. In some embodiments, the second bonding process is conducted by a mass reflow process. Then, an underfill 45 may be disposed in a space between the substrate structure 5 and the second wiring structure 41 to cover and protect the first bonding structure 51 and the second bonding structure 52. As such, a package structure having a structure similar to that of the package structure 1e shown in FIG. 8 except the first bonding structure 51A being replaced by the first bonding structure 51 shown in FIG. 7 may be formed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
   a first wiring structure; and
   at least one electronic device connected to the first wiring structure through at least two joint structures, the at least two joint structures respectively including different materials, wherein the at least two joint structures includes at least one first joint structure including a first material and at least one second joint structure including a second material, and a melting point of the first material is higher than a melting point of the second material.

2. The package structure as claimed in claim 1, wherein the at least two joint structures each includes a first bump and a second bump disposed on the at least one electronic device, the first bump includes the first material, and the second bump includes the second material.

3. The package structure as claimed in claim 2, wherein the first bump is located corresponding to a peripheral region of the at least one electronic device from a top view.

4. The package structure as claimed in claim 3, wherein the at least one electronic device includes a first electronic device and a second electronic device arranged side by side, and the first bump is located corresponding to a peripheral region of a combination of the first electronic device and the second electronic device.

5. The package structure as claimed in claim 2, wherein the first material of the first bump includes a gold-tin (AuSn) alloy, and the second material of the second bump includes copper.

6. The package structure as claimed in claim 1, wherein the at least two joint structures each includes a first solder and a second solder disposed between the first wiring structure and a bump of the at least one electronic device, the first solder includes the first material, and the second solder includes the second material.

7. The package structure as claimed in claim 6, wherein the first solder is located corresponding to a peripheral region of the at least one electronic device from a top view.

8. The package structure as claimed in claim 7, wherein the at least one electronic device includes a first electronic device and a second electronic device arranged side by side, and the first solder is located corresponding to a peripheral region of a combination of the first electronic device and the second electronic device.

9. The package structure as claimed in claim 6, wherein the first material of the first solder includes silver (Ag) paste, copper (Cu) paste, or a combination thereof, and the second material of the second solder includes tin (Sn).

10. The package structure as claimed in claim 1, wherein the at least two joint structures each includes a first pad and a second pad disposed in the first wiring structure, and the first joint structure further includes a first conductive layer disposed on the first pad.

11. A package structure, comprising:
    a first wiring structure;
    a lower electronic device disposed on the first wiring structure;
    a molding compound encapsulating the lower electronic device; and
    a substrate structure connected to the first wiring structure through at least two bonding structures, the at least two bonding structures respectively including different materials.

12. The package structure as claimed in claim 11, wherein the at least two bonding structures include a first bonding structure including a first boning material, and a second bonding structure including a second boning material, and a melting point of the first bonding material is higher than a melting point of the second bonding material.

13. The package structure as claimed in claim 11, further comprising:
    a bonding pad disposed on a side of the first wiring structure opposite to the lower electronic device;
    wherein the substrate structure includes a first conductive path and a second conductive path physically contacting the bonding pad, and an end of the first conductive path and an end of the second conductive path are exposed from an upper surface of the substrate structure.

14. The package structure as claimed in claim 11, further comprising:
    a second wiring structure disposed on the molding compound; and
    a first electronic device connected to the second wiring structure,
    wherein an active surface of the lower electronic device is facing an active surface of the first electronic device.

15. The package structure as claimed in claim 14, further comprising:
    a bonding pad disposed in the first wiring structure;
    an encapsulant encapsulating the first electronic device; and a first electrical path and a second electrical path extending through the encapsulant, the second wiring structure, and the molding compound, wherein the first electrical path and the second electrical path physically contact the bonding pad.

16. The package structure as claimed in claim 15, wherein an end of the first electrical path and an end of the second electrical path are exposed from an upper surface of the encapsulant.

17. A method for manufacturing a package structure, comprising:
   (a) providing a first wiring structure;
   (b) providing a first electronic device on the first wiring structure;
   (c) bonding the first electronic device to the first wiring structure through a first joint structure under a first temperature; and
   (d) bonding the first electronic device to the first wiring structure through a second joint structure under a second temperature, wherein the first temperature is higher than the second temperature.

18. The method as claimed in claim 17, wherein in (c), the first joint structure is formed by conducting a laser technique.

19. The method as claimed in claim 17, wherein in (d), the second joint structure is formed by conducting a mass reflow process.

20. The method as claimed in claim 17, wherein (c) includes:
   (c1) arranging a mask defining at least one opening corresponding to a predetermined position of the first joint structure, wherein a first heating process under the first temperature is conducted through the at least one opening.

* * * * *